(12) United States Patent
Kim et al.

(10) Patent No.: US 8,993,439 B2
(45) Date of Patent: Mar. 31, 2015

(54) METHOD OF MANUFACTURING A SEMICONDUCTOR DEVICE

(71) Applicant: Samsung Electronics Co., Ltd., Suwon-si, Gyeonggi-do (KR)

(72) Inventors: Yong-Jun Kim, Suwon-si (KR); Kil-Ho Lee, Hwaseong-si (KR); Ki-Joon Kim, Hwaseong-si (KR); Myoung-Su Son, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/285,969

(22) Filed: May 23, 2014

(65) Prior Publication Data

US 2014/0377950 A1     Dec. 25, 2014

(30) Foreign Application Priority Data

Jun. 19, 2013   (KR) .................. 10-2013-0070471

(51) Int. Cl.
  *H01L 21/44*  (2006.01)
  *H01L 21/768*  (2006.01)
(52) U.S. Cl.
  CPC ............................. *H01L 21/76807* (2013.01)
  USPC .................... 438/666; 438/618; 257/E21.585

(58) Field of Classification Search
  USPC ................................................. 257/E21.595
  See application file for complete search history.

(56) References Cited

U.S. PATENT DOCUMENTS 8,119,512 B1    2/2012 Lee

FOREIGN PATENT DOCUMENTS

KR       10-0468697 B1    3/2005
KR    10-2010-0037406 A    4/2010

*Primary Examiner* — Cheung Lee
(74) *Attorney, Agent, or Firm* — Lee & Morse, P.C.

(57) ABSTRACT

A method of manufacturing a semiconductor device, including forming a molding layer; forming a damascene mask layer and mask layer on the molding layer; forming a mask layer pattern by etching the mask layer; forming a damascene pattern by partially etching the damascene mask layer; forming a damascene mask layer on the mask layer pattern to bury the damascene pattern; forming a damascene pattern partially overlapping the damascene pattern by etching the damascene mask layer and the mask layer pattern; connecting the damascene pattern and the damascene pattern by removing a portion of the mask layer pattern exposed by the damascene pattern; forming a damascene mask layer on the damascene mask layer to bury the damascene pattern; and forming a trench under the damascene patterns by etching the damascene mask layers and the molding layer using remaining portions of the mask layer pattern.

20 Claims, 46 Drawing Sheets

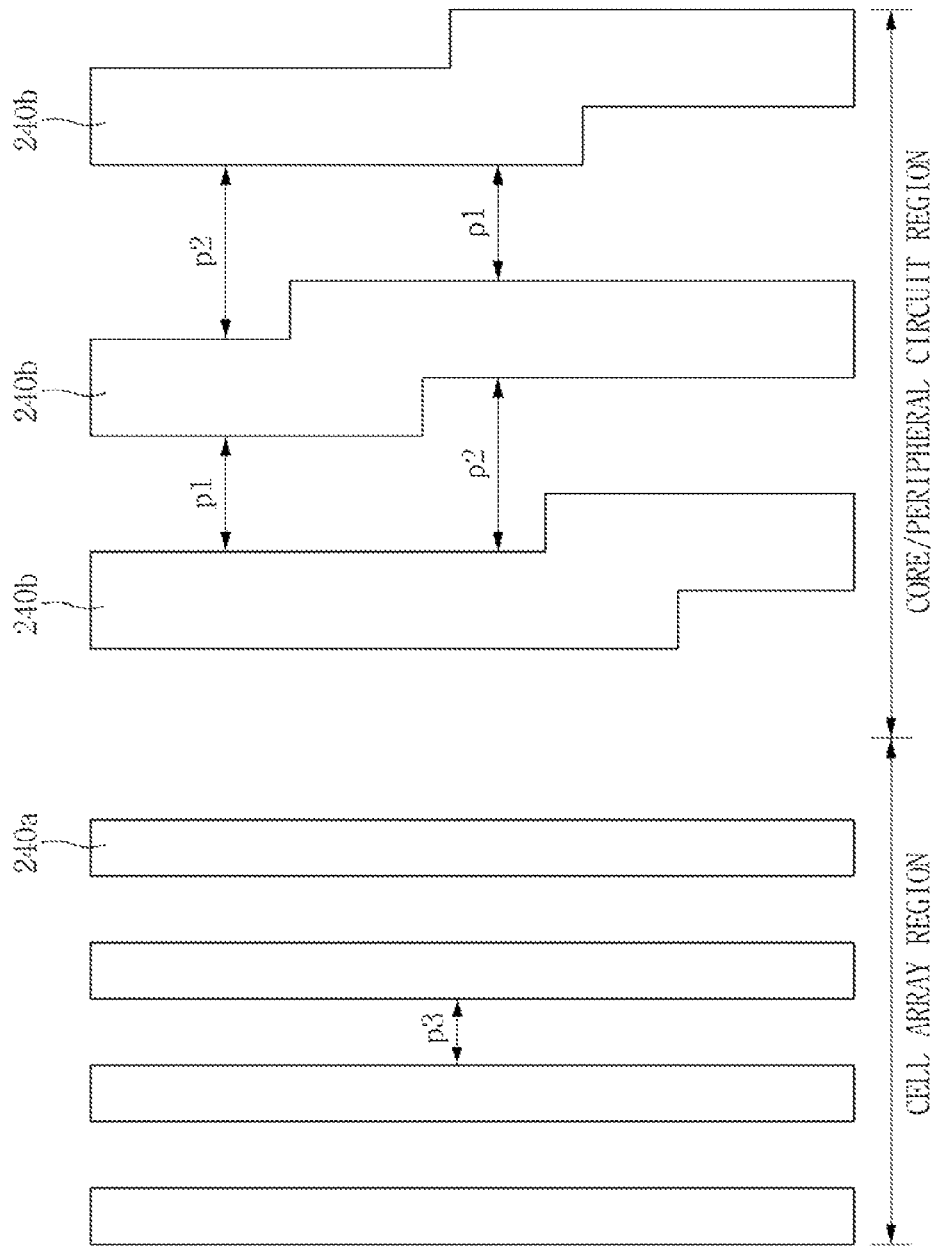

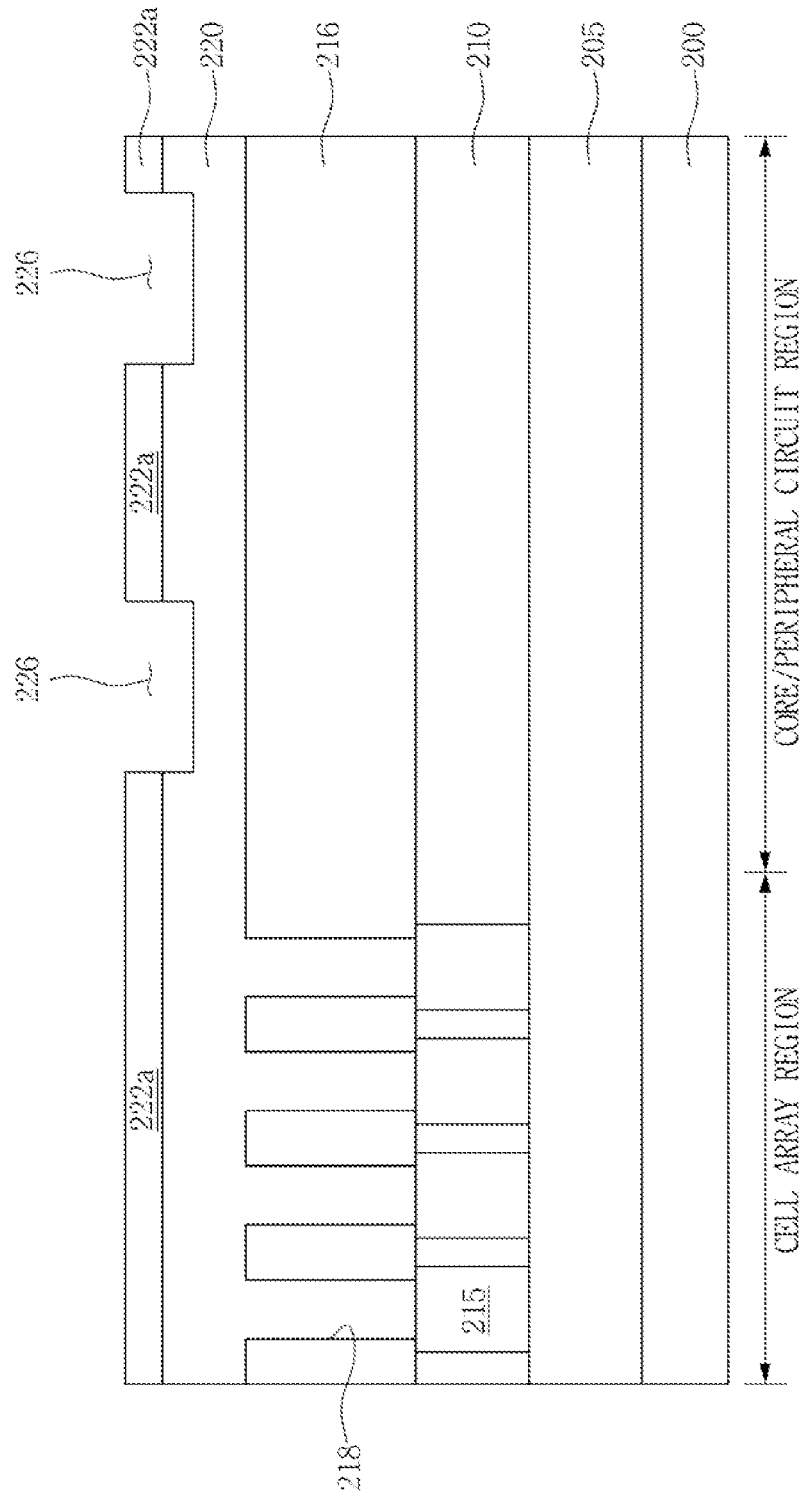

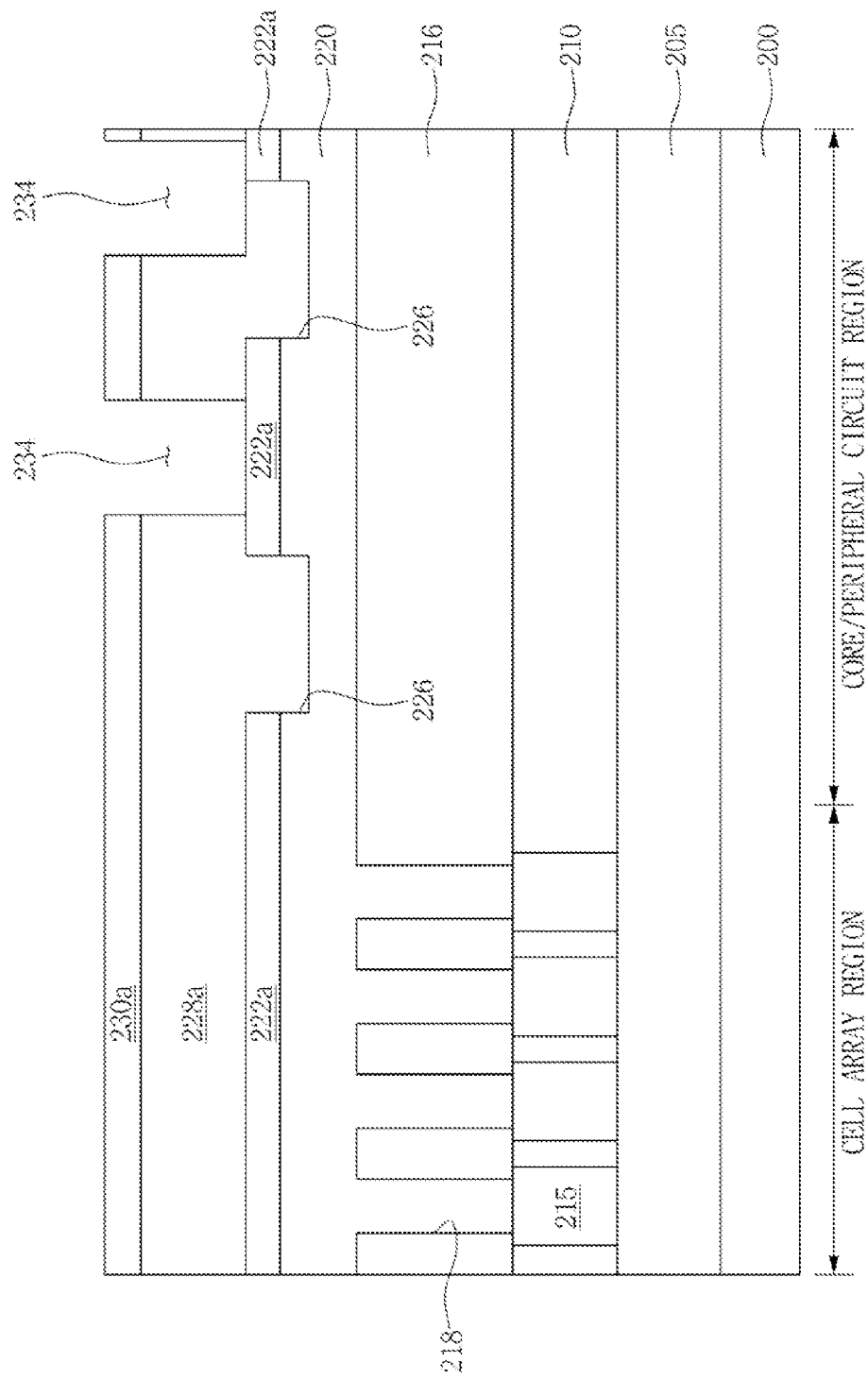

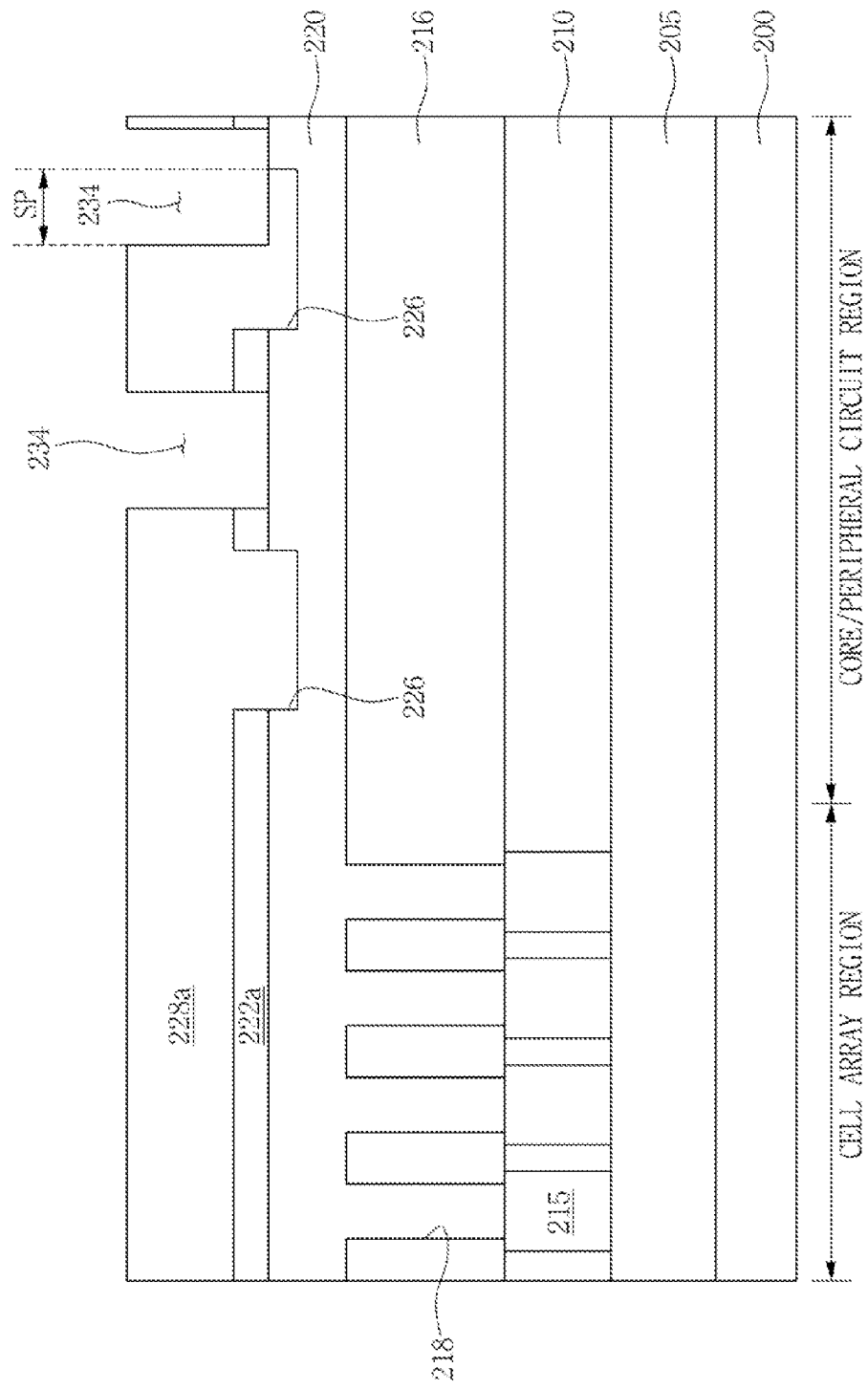

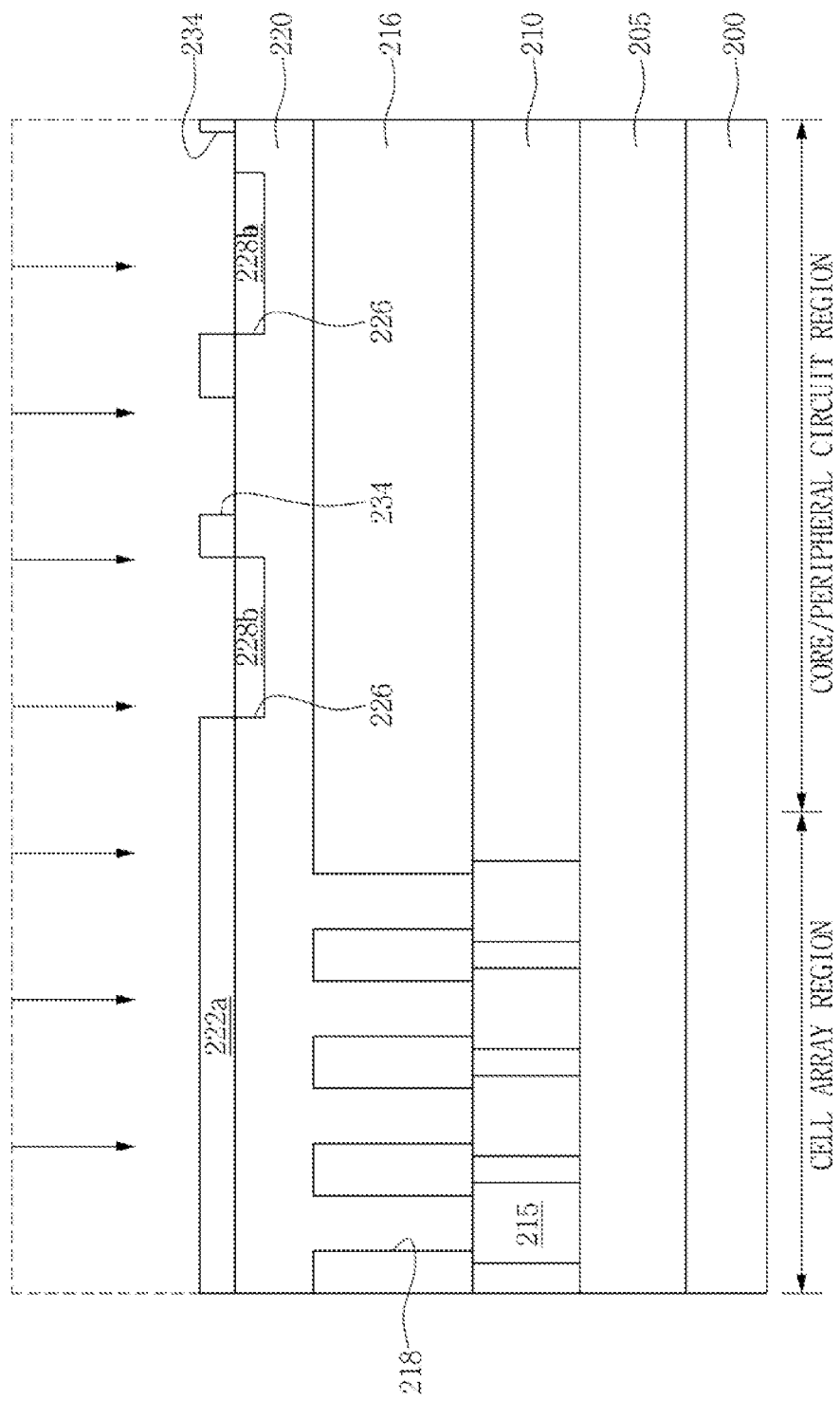

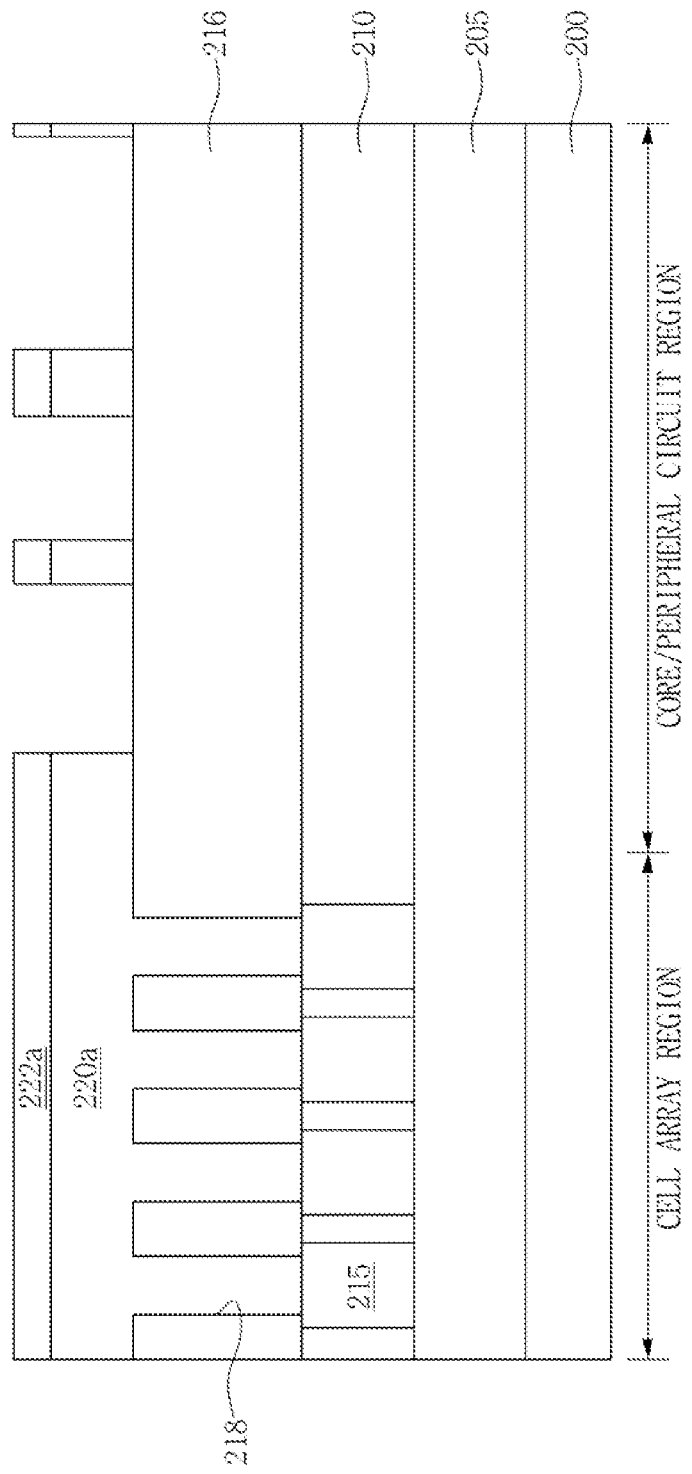

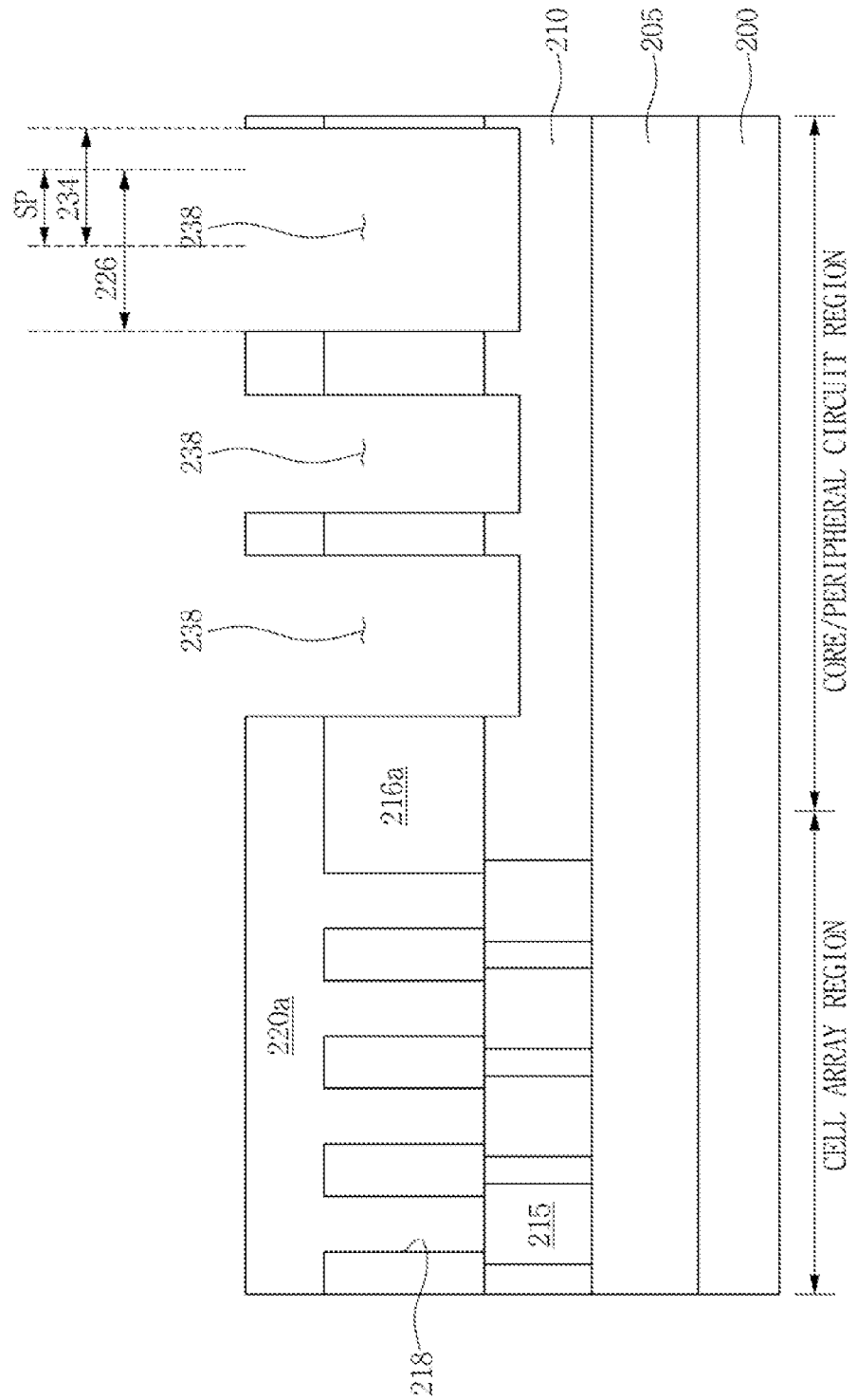

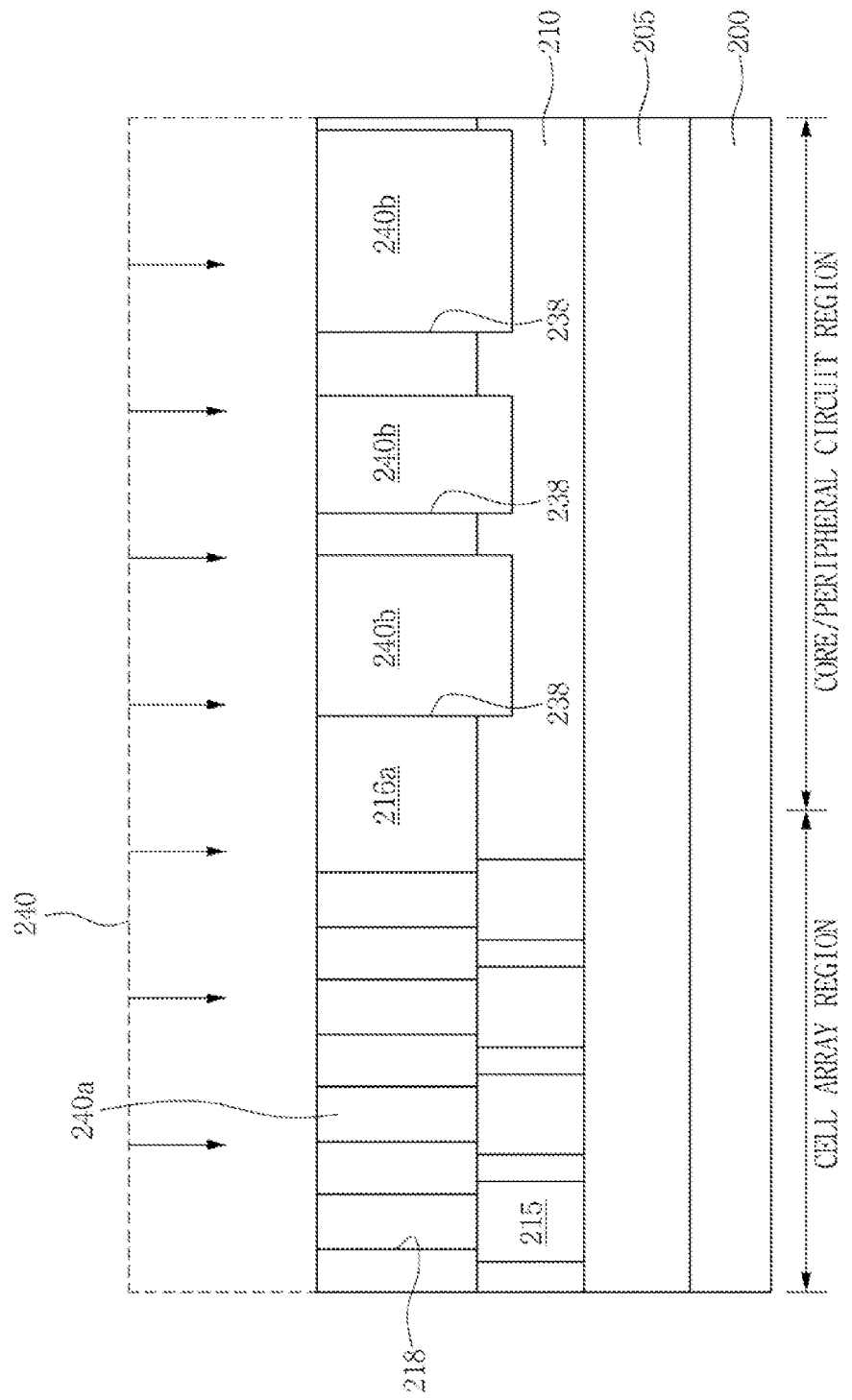

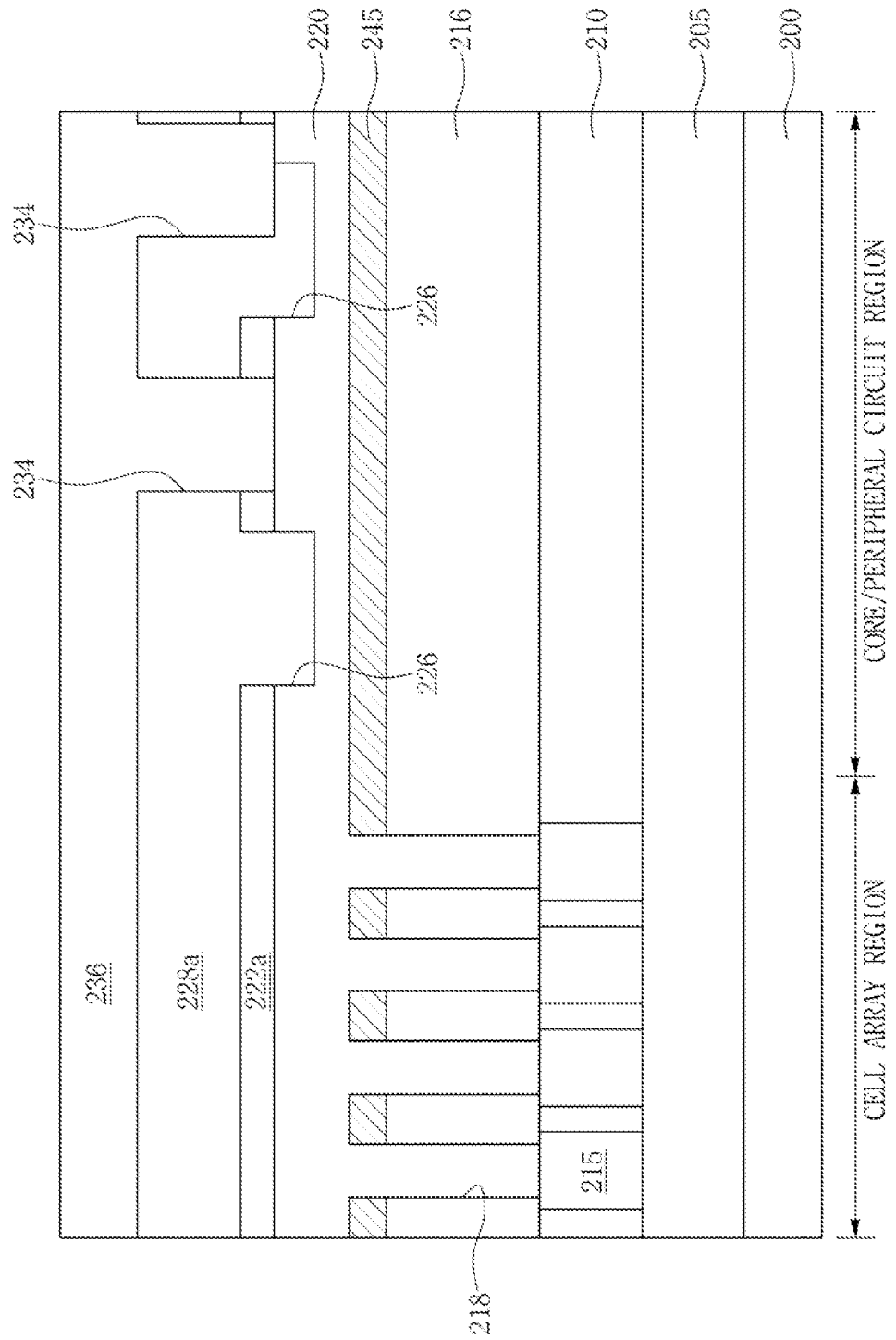

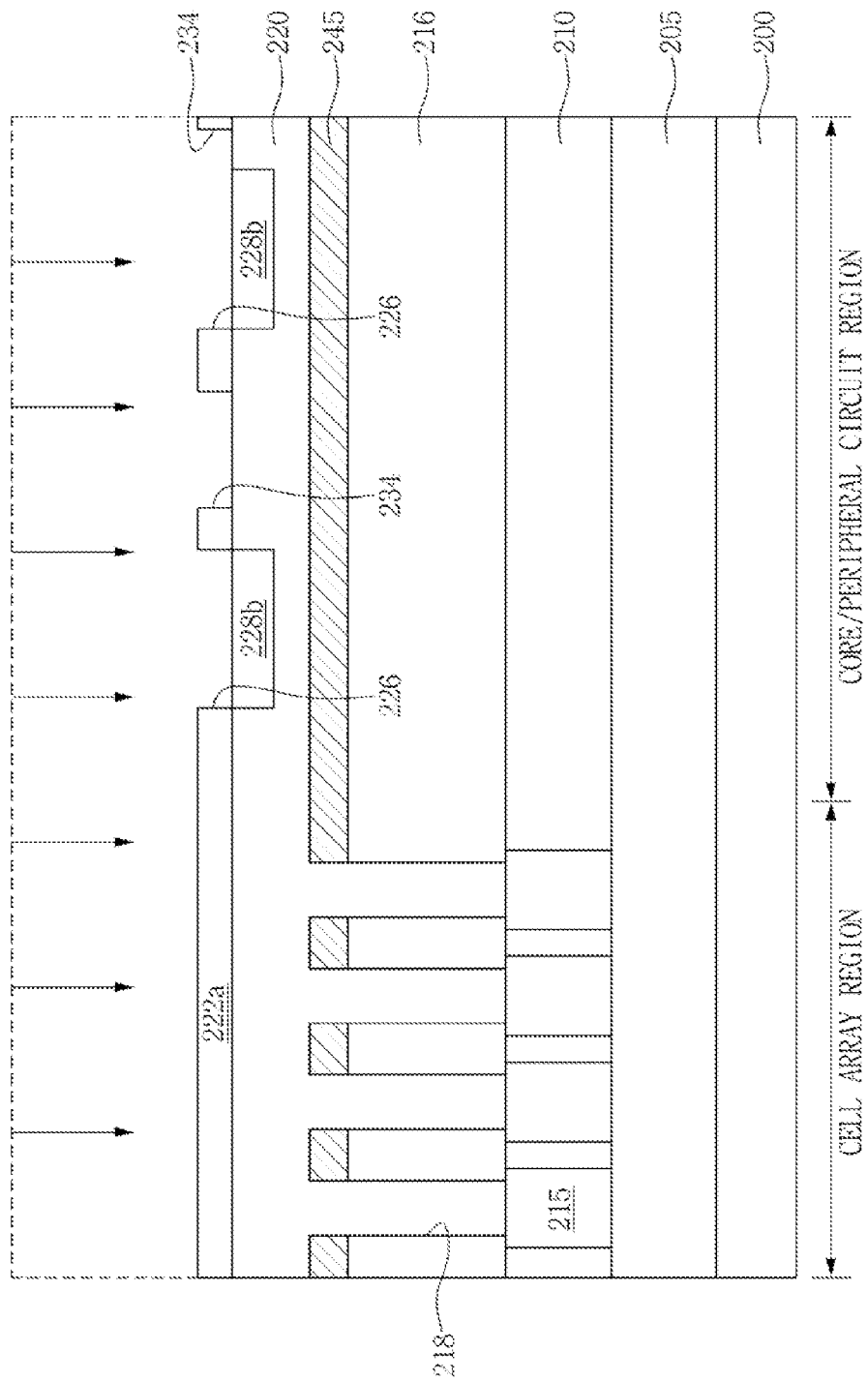

METHOD OF MANUFACTURING A SEMICONDUCTOR DEVICE

CROSS-REFERENCE TO RELATED APPLICATION

Korean Patent Application No. 10-2013-0070471, filed on Jun. 19, 2013, in the Korean Intellectual Property Office, and entitled: "Method Of Manufacturing Semiconductor Device," is incorporated by reference herein in its entirety.

BACKGROUND

1. Field

Embodiments relate to a method of manufacturing a semiconductor device.

2. Description of Related Art

With increases in the degree of integration of semiconductor devices, a design rule of components of the semiconductor devices may be reduced.

SUMMARY

Embodiments are directed to a method of manufacturing a semiconductor device

The embodiments may be realized by providing a method of manufacturing a semiconductor device, the method including forming a molding layer on a substrate; sequentially forming a first damascene mask layer and a first mask layer on the molding layer; forming a first mask layer pattern by etching the first mask layer; forming a first damascene pattern by partially etching the first damascene mask layer using the first mask layer pattern as a mask; forming a second damascene mask layer on the first mask layer pattern to bury the first damascene pattern; forming a second damascene pattern partially overlapping the first damascene pattern by etching the second damascene mask layer and the first mask layer pattern; connecting the first damascene pattern and the second damascene pattern by removing a portion of the first mask layer pattern exposed by the second damascene pattern; forming a third damascene mask layer on the second damascene mask layer to bury the second damascene pattern; and forming a trench extending from the first and second damascene patterns by etching the third, second, and first damascene mask layers and the molding layer using remaining portions of the first mask layer pattern.

The method may further include, before forming the second damascene pattern forming a second mask layer on the second damascene mask layer; and forming a second mask layer pattern opening a region in which the second damascene pattern is to be formed by etching the second mask layer.

As the portion of the first mask layer pattern exposed by the second damascene pattern is removed, the second mask layer pattern may also be removed.

Forming the second damascene pattern by etching the second damascene mask layer and the first mask layer pattern may include forming a second damascene mask layer pattern that buries the first damascene pattern and that includes the second damascene pattern therein.

Forming the trench extending from the first and second damascene patterns by etching the third, second, first damascene mask layers and the molding layer using the remaining portions of the first mask layer pattern may include retaining portions of the second damascene mask layer pattern in the first damascene pattern by etching back the third damascene mask layer and the second damascene mask layer pattern to the remaining portions of the first mask layer pattern; and etching the remaining portions of the second damascene mask layer pattern, first damascene mask layer, and molding layer using the remaining portions of the first mask layer pattern.

The method may further include forming a metallic hard mask layer on the molding layer prior to forming the first damascene mask layer.

Forming the trench may include uniformly etching the molding layer such that the trench has a flat bottom.

The method may further include, after forming the trench removing the first damascene mask layer; and forming a damascene wiring to bury the trench.

The first, second, and third damascene mask layers may include carbon-containing layers.

The first mask layer may include silicon oxynitride.

The embodiments may be realized by providing a method of manufacturing a semiconductor device, the method including forming a molding layer on a semiconductor substrate, the semiconductor substrate including a cell array region and a core/peripheral circuit region; sequentially forming a first damascene mask layer and a first mask layer on the molding layer; forming a first mask layer pattern by etching the first mask layer; forming a first damascene pattern in the core/peripheral circuit region by partially etching the first damascene mask layer; forming a second damascene mask layer on the first mask layer pattern and the first damascene pattern; forming a second damascene pattern that partially overlaps the first damascene pattern in the core/peripheral circuit region by etching the second damascene mask layer and the first mask layer pattern; connecting the first damascene pattern and the second damascene pattern by removing a portion of the first mask layer pattern that is exposed by the second damascene pattern; forming a third damascene mask layer on the second damascene mask layer and the second damascene pattern; and forming trenches extending from the first and second damascene patterns by etching the third, second, and first damascene mask layers and the molding layer using remaining portions of the first mask layer pattern.

The method may further include, before forming the second damascene pattern forming a second mask layer on the second damascene mask layer; and forming a second mask layer pattern opening a region in which the second damascene pattern is to be formed by etching the second mask layer.

The method may further include forming a metallic hard mask layer on the molding layer before forming the first damascene mask layer.

The method may further include forming cell trenches that expose regions in which bit lines of the cell array region are to be formed in the molding layer, before forming the first damascene mask layer, wherein the first damascene mask layer buries the cell trenches.

Forming the trenches may include uniformly etching the molding layer such that the trenches have flat bottoms.

The embodiments may be realized by providing a method of manufacturing a semiconductor device, the method including forming a molding layer on a substrate; forming a first damascene mask layer on the molding layer; forming a first mask layer on the first damascene mask layer; forming a first mask layer pattern by etching the first mask layer; forming a first damascene pattern by partially etching the first damascene mask layer using the first mask layer pattern as a mask; forming a second damascene mask layer on the first mask layer pattern such that the second damascene mask layer fills the first damascene pattern; forming a second damascene pattern that partially overlaps the first damascene pattern by etching the second damascene mask layer; connecting the first damascene pattern and the second damascene pattern by removing a portion of the first mask layer pattern exposed by the second damascene pattern and further etching the second damascene mask layer; forming a third damascene mask layer on the second damascene mask layer such that the third damascene mask layer fills the second damascene pattern; patterning remaining layers on the molding layer to form a trench mask pattern; and forming a trench in the molding layer by etching the molding layer using the trench mask pattern as a mask.

The method may further include forming a metallic hard mask layer on the molding layer prior to forming the first damascene mask layer.

Forming the trench may include uniformly etching the molding layer such that the trench has a flat bottom.

The method may further include forming a damascene wiring in the trench.

The first, second, and third damascene mask layers may each include carbon-containing layers, and the first mask layer may include silicon oxynitride.

BRIEF DESCRIPTION OF THE DRAWINGS

Features will be apparent to those of skill in the art by describing in detail exemplary embodiments with reference to the attached drawings in which:

FIG. 4A illustrates a plan view of a bit line of a semiconductor device according to an embodiment;

FIGS. 5A to 5M illustrate cross-sectional views of stages in a method of manufacturing a semiconductor device according to an embodiment;

FIGS. 6A to 6G illustrate cross-sectional views of stages in a method of manufacturing a semiconductor device according to an embodiment;

DETAILED DESCRIPTION

Figure 1A:
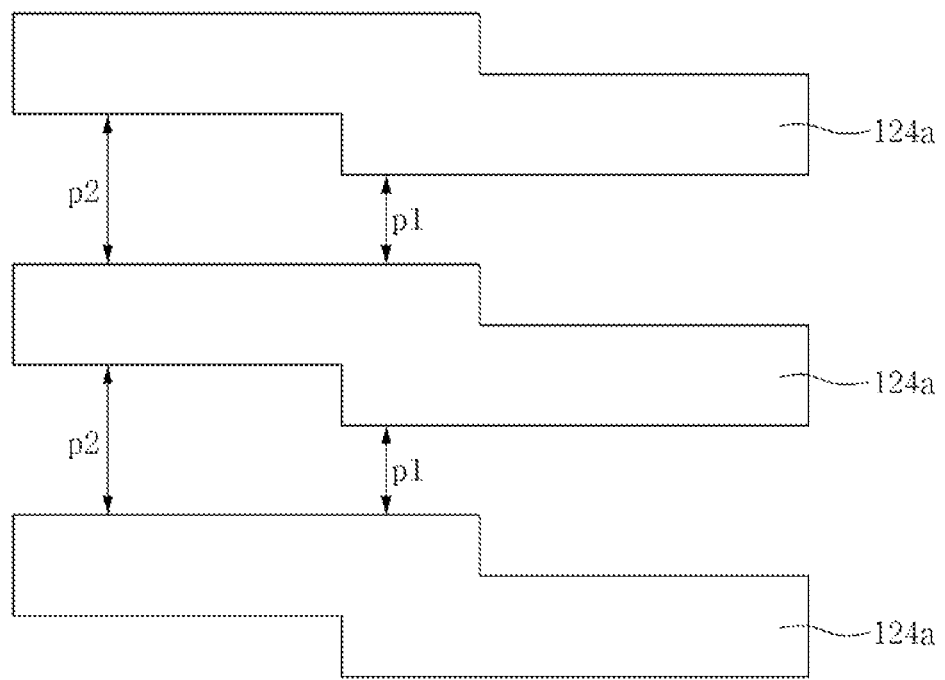
FIG. 1A illustrates a plan view of a damascene wiring of a semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

The terminology used herein to describe embodiments is not intended to limit the scope. The articles "a," "an," and "the" are singular in that they have a single referent, however the use of the singular form in the present document should not preclude the presence of more than one referent. In other words, elements referred to in the singular may number one or more, unless the context clearly indicates otherwise. It will be further understood that the terms "comprises," "comprising," "includes," and/or "including," when used herein, specify the presence of stated features, items, steps, operations, elements, components, and/or group thereof, but do not preclude the presence or addition of one or more other features, items, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Terms such as "beneath," "below," "lower," "above," "upper" and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation. Also, the device may reoriented in other ways (rotated 90 degrees or at other orientations) and the descriptors used herein should be interpreted accordingly.

It will be understood that, although the terms first, second, A, B, etc. may be used herein in reference to elements, such elements should not be construed as limited by these terms. For example, a first element could be termed a second element, and a second element could be termed a first element, without departing from the scope. Herein, the term "and/or" includes any and all combinations of one or more referents.

Embodiments are described herein with reference to cross-section and/or plan illustrations that are schematic illustrations of idealized embodiments. In the drawings, the thicknesses of layers and regions are exaggerated for clarity. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope.

Figure 1B:
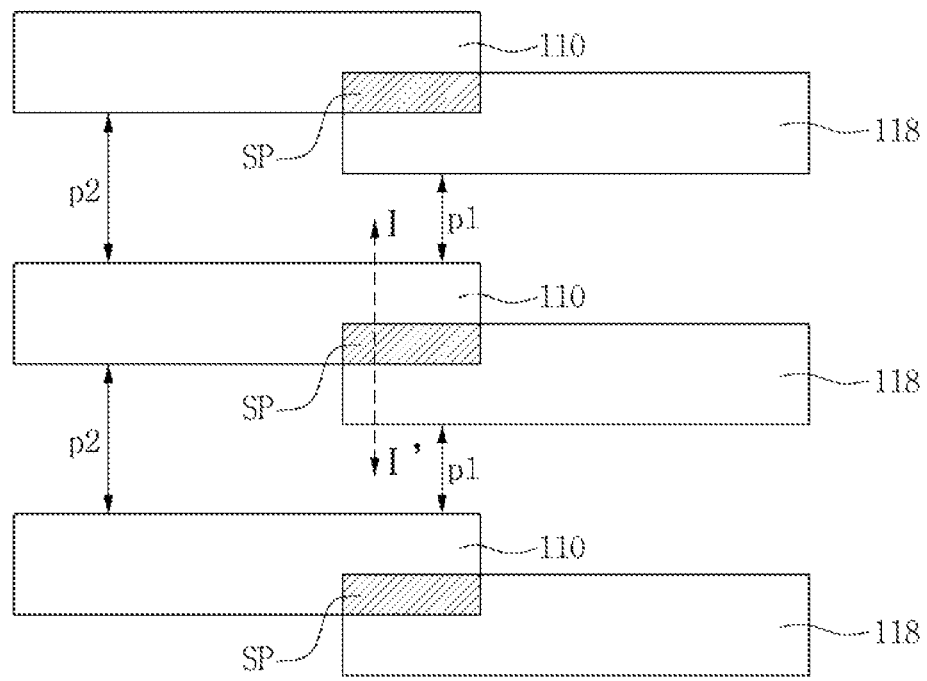
FIG. 1B illustrates a plan view of a damascene pattern for forming the damascene wiring of FIG. 1A.

FIG. 1A illustrates a plan view of a damascene wiring of a semiconductor device according to an embodiment. FIG. 1B illustrates a plan view of a damascene pattern for forming the damascene wiring of FIG. 1A.

Referring to FIGS. 1A and 1B, a semiconductor device according to an embodiment may include wirings 124a repeatedly arranged in a fine first pitch p1 in one region, and repeatedly arranged in a second pitch p2 (larger than the first pitch p1) in another region.

The wirings 124a may be formed using a damascene process (to overcome a patterning limitation of a photolithographic process).

A spacing distance between the wirings 124a may be reduced according to high integration of the semiconductor device. When the first pitch p1 between the wirings 124a is determined to a limit resolution of a photolithographic process or less, as illustrated in FIG. 1B, the fine first pitch p1 between the wirings 124a may be implemented by dividing the wirings into damascene patterns 110 and 118 through performing a photolithographic process and an etching process several times and using a damascene stitch pattern SP in which the divided damascene patterns 110 and 118 overlap each other FIGS. 2A to 2M illustrate cross-sectional views of stages in a method of manufacturing a semiconductor device according to an embodiment, taken along line I-I' of FIG. 1B.

Figure 2A:
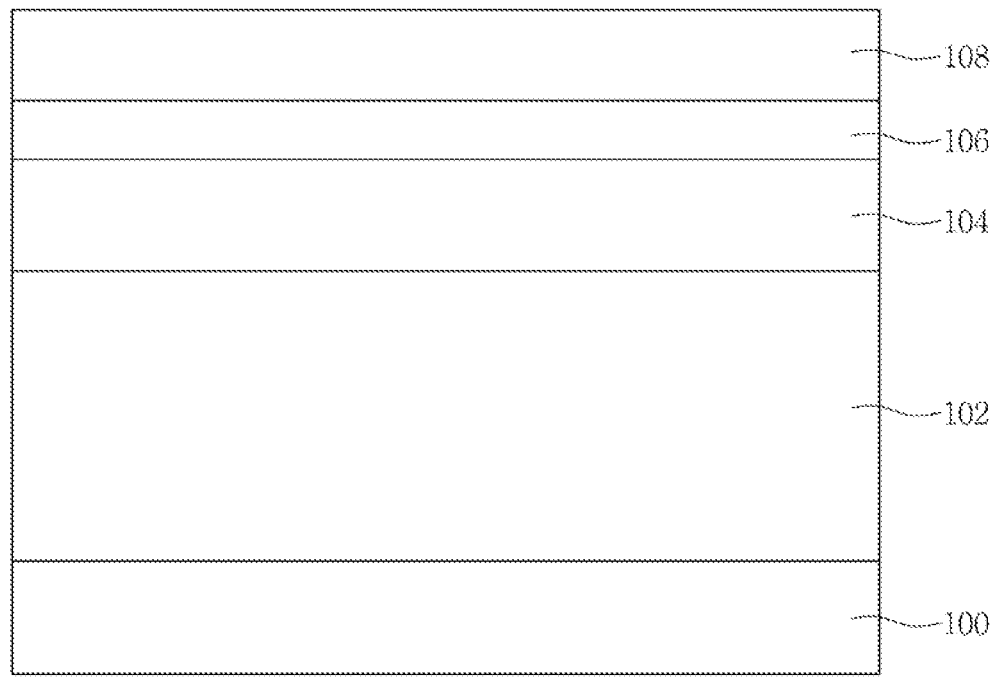
FIGS. 2A to 2M illustrate cross-sectional views of stages in a method of manufacturing a semiconductor device according to an embodiment.

Referring to FIG. 2A, a substrate 100 may be provided.

The substrate 100 may be a semiconductor substrate, e.g., silicon (Si), silicon germanium (SiGe), germanium (Ge), gallium arsenic (GaAs), or silicon on insulator (SOD. The substrate 100 may include a conductive layer or an insulating layer. The substrate 100 may further include, e.g., a conductive structure such as a word line, or semiconductor devices.

A molding layer 102 may be formed on the substrate 100. The molding layer 102 may be a layer configured to provide a pattern shape according to a damascene process, and may include a selectively etchable material in a subsequent process, e.g., silicon oxide.

A first damascene mask layer 104, a first mask layer 106, and a first photoresist layer 108 may be sequentially formed on the molding layer 102.

The first damascene mask layer 104 may be provided as a hard mask layer for etching the molding layer 102. The first damascene mask layer 104 may be formed of a material having etch selectivity with respect to the molding layer 102 therebelow. For example, the first damascene mask layer 104 may be formed of a carbon-containing layer such as a spin on hard mask (SOH) layer. The SOH layer may be formed of, e.g., an organic compound including a hydrocarbon compound containing an aromatic ring such as phenyl, benzene, or naphthalene or derivatives thereof. The SOH layer may be formed through a spin coating process.

In addition to a hard mask function for etching the first damascene mask layer 104, the first mask layer 106 may help prevent a light source from being scattered in an exposure process for forming a photoresist pattern, and may be provided as an anti-reflective layer (ARL) for improving a profile of the photoresist pattern. The first mask layer 106 may be formed of a material having etch selectivity with respect to the first damascene mask layer 104. For example, the first mask layer 106 may include silicon oxynitride (SiON).

Figure 2B:
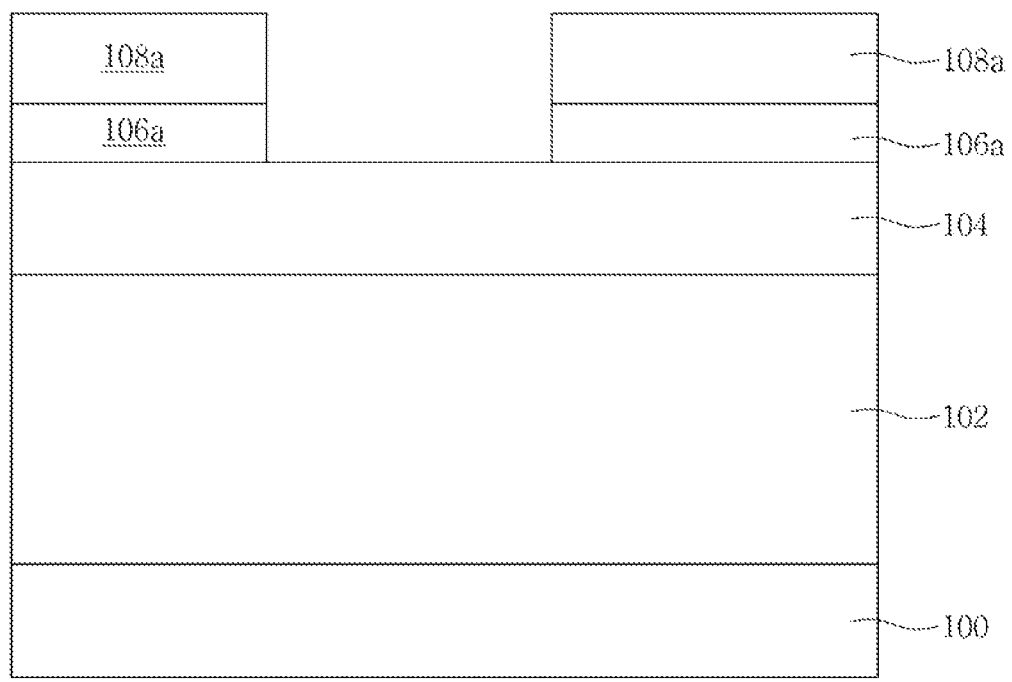

Referring to FIG. 2B, the first photoresist layer 108 may be patterned to form a first photoresist pattern 108a opening, exposing, or overlying a region in which the first damascene pattern 110 illustrated in FIG. 1B is to be formed.

The first mask layer 106 may be etched using the first photoresist pattern 108a as an etching mask to form a first mask layer pattern 106a.

Figure 2C:
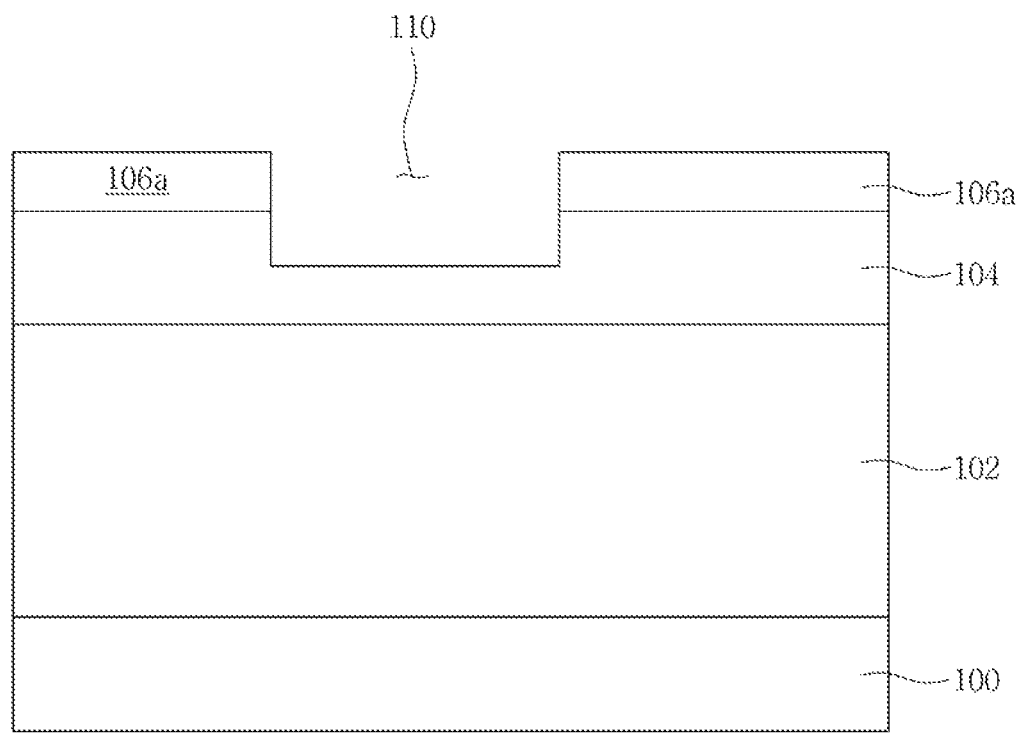

Referring to FIG. 2C, the first damascene mask layer 104 may be partially etched using the first mask layer pattern 106a as an etch mask to form the first damascene pattern 110. When the first damascene mask layer 104 is etched, the first photoresist pattern 108a (having a similar etch property with respect to the first damascene mask layer 104) may be removed.

Figure 2D:
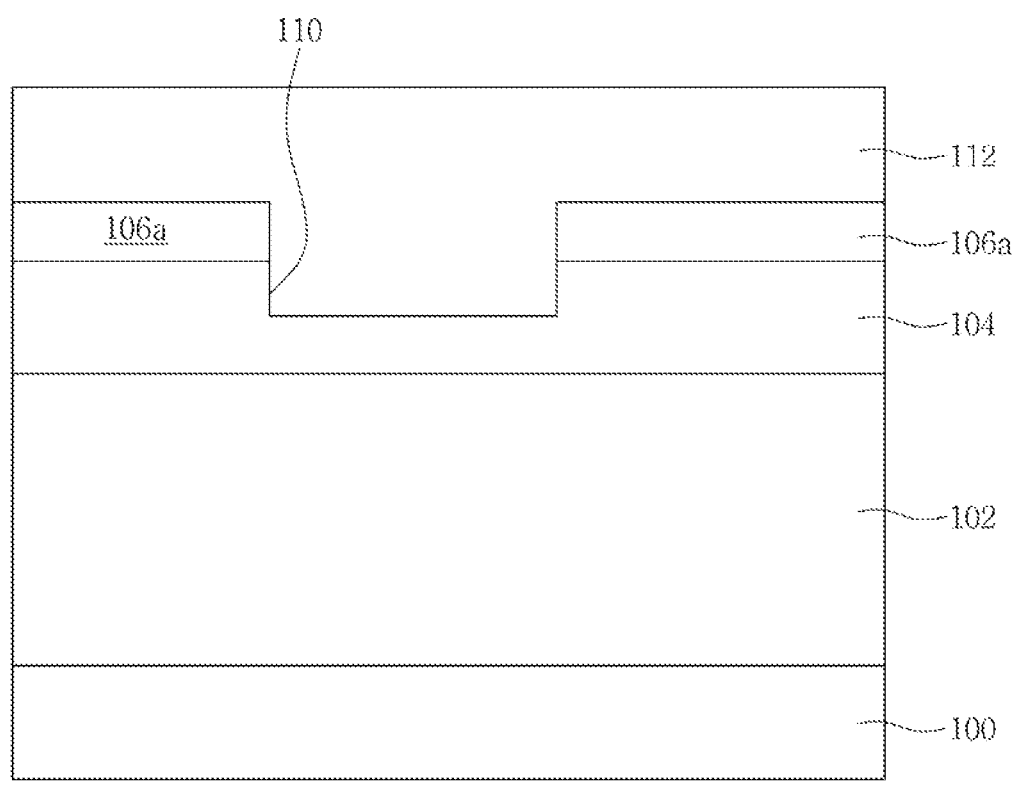

Referring to FIG. 2D, a second damascene mask layer 112 may be formed on the first mask layer pattern 106a to bury or fill the first damascene pattern 110.

The second damascene mask layer 112 may include a material having a similar etch property with respect to the first damascene mask layer 104, e.g., may include a carbon-containing layer such as SOH. The second damascene mask layer 112 may be formed through a spin coating process.

Figure 2E:
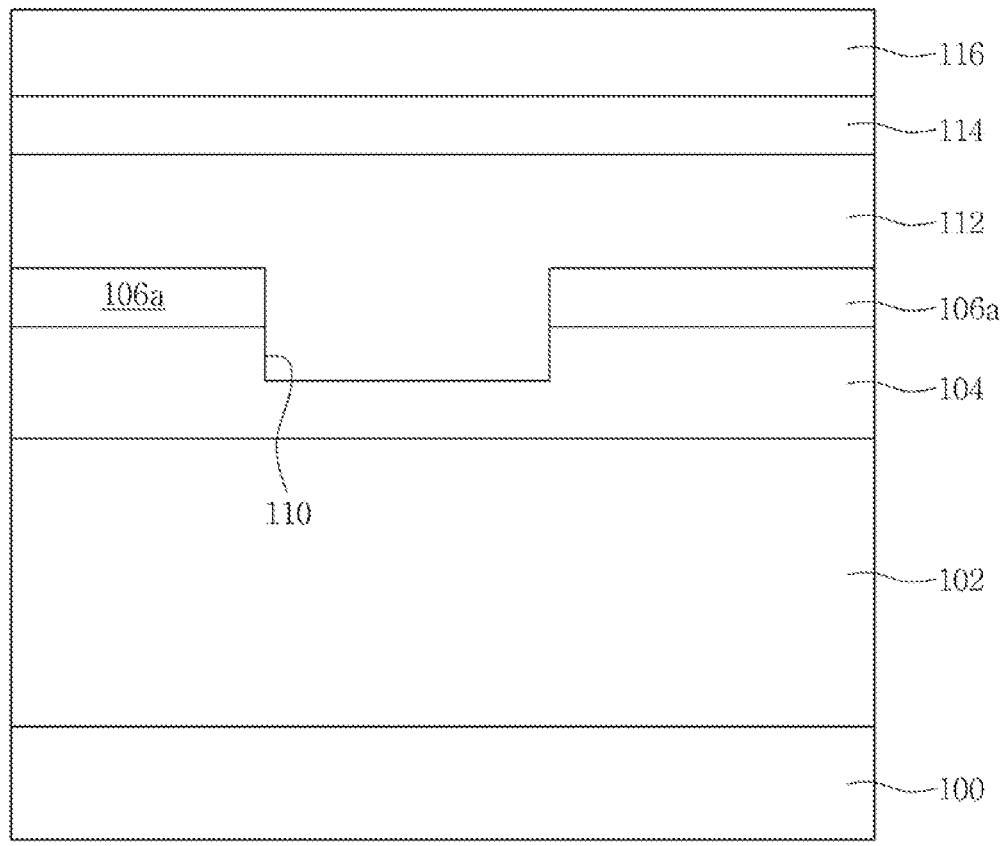

Referring to FIG. 2E, a second mask layer 114 and a second photoresist layer 116 may be sequentially formed on the second damascene mask layer 112.

In addition to a hard mask function for etching the second damascene mask layer 112, the second mask layer 114 may help prevent a light source from being scattered in an exposure process for forming a photoresist pattern, and may be provided as an ARL for improving a profile of the photoresist pattern. The second mask layer 114 may be formed of a material having an etch selectivity with respect to the second damascene mask layer 112, e.g., SiON.

Figure 2F:
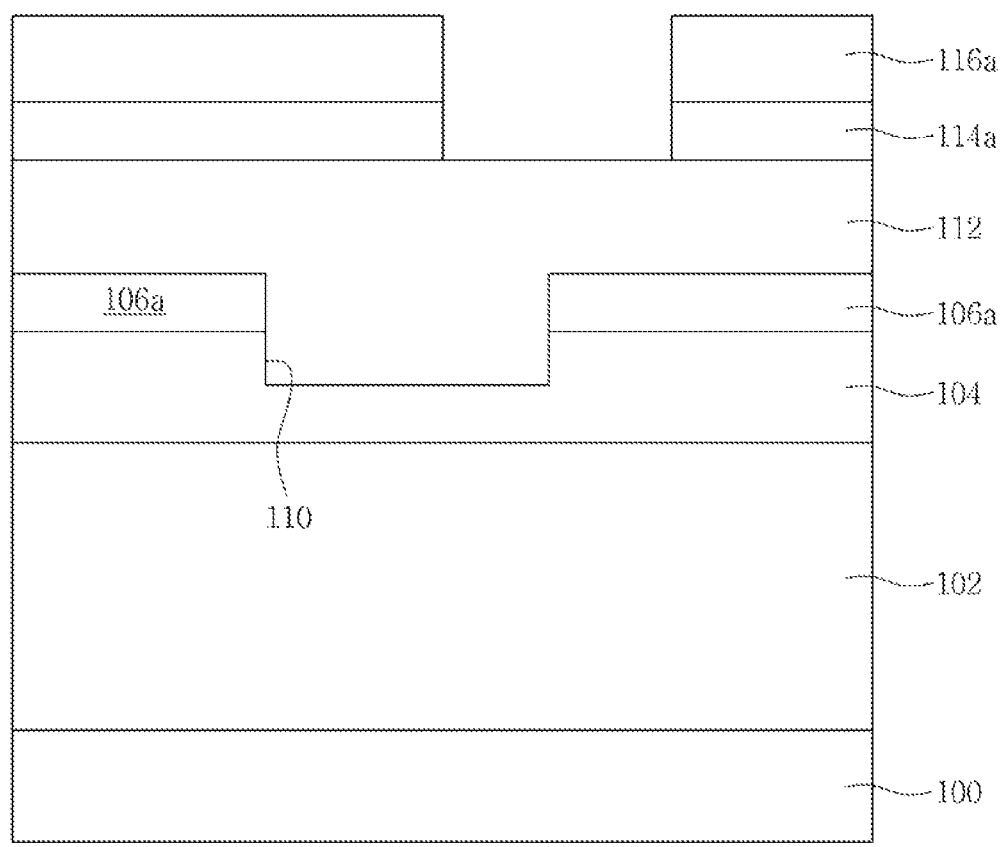

Referring to FIG. 2F, the second photoresist layer 116 may be patterned to form a second photoresist pattern 116a opening, exposing, or overlying a region in which the second damascene pattern 118 (illustrated in FIG. 1B) is to be formed.

The second mask layer 114 may be etched (using the second photoresist pattern 116a as an etch mask) to form a second mask layer pattern 114a.

Figure 2G:
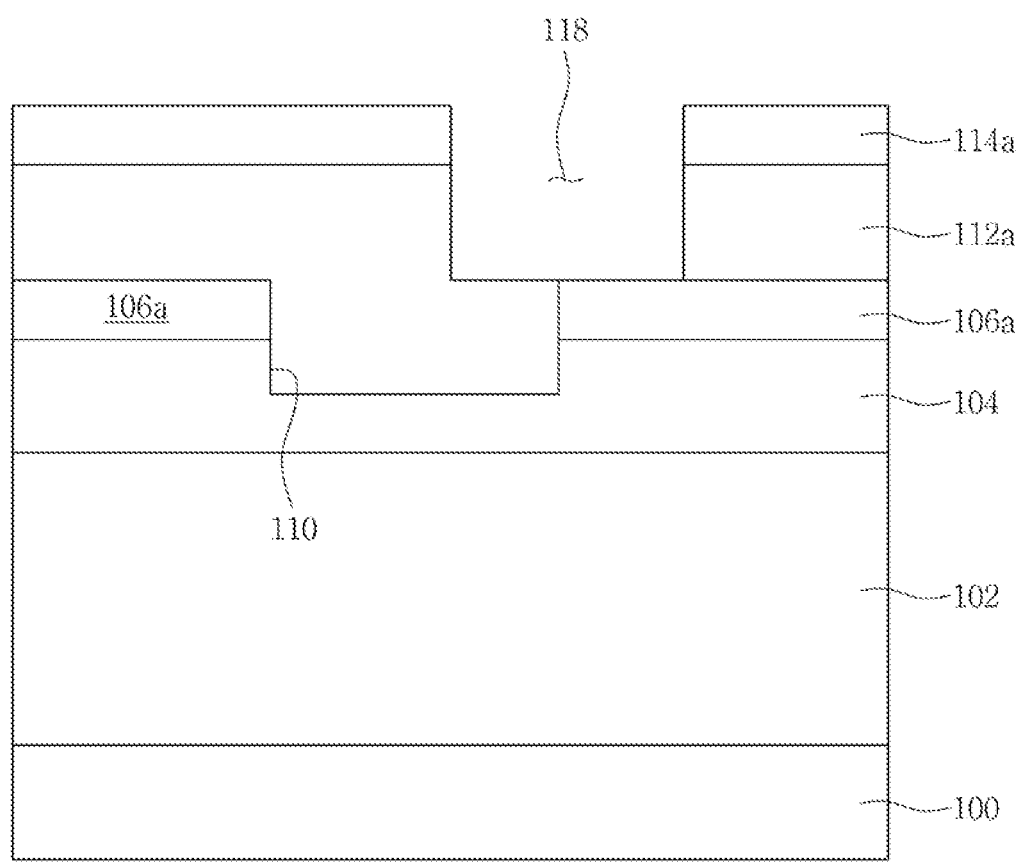

Referring to FIG. 2G, the second damascene mask layer 112 may be etched (using the second mask layer pattern 114a as an etch mask) to form the second damascene pattern 118.

The etching process of the second damascene mask layer 112 may be performed to be completed at or on a surface of the first mask layer pattern 106a, e.g., the etching process of the second damascene mask layer 112 may stop when the first mask layer pattern 106a is reached or exposed. When the second damascene mask layer 112 is etched, the second photoresist pattern 116a (having a similar etch property with respect to the second damascene mask layer 112) may also be removed.

The second damascene pattern 118 may partially overlap the first damascene pattern 110 (as illustrated in FIG. 1B).

Through the etching process for forming the second damascene pattern 118, a second damascene mask layer pattern 112a (burying or filling the first damascene pattern 110 and including the second damascene pattern 118 therein) may be formed.

Figure 2H:
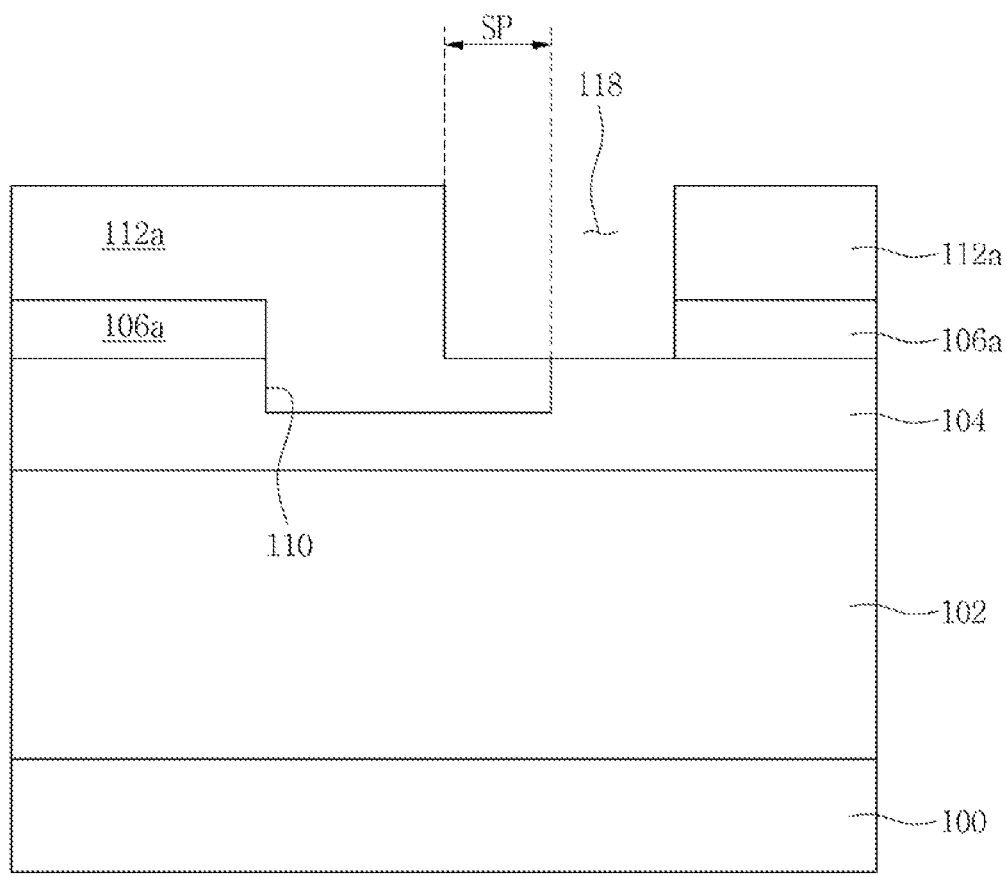

Referring to FIG. 2H, a portion of the first mask layer pattern 106a that is exposed by the second damascene pattern 118 may be removed. In an implementation, portions of the second damascene mask layer pattern 112a adjacent to the first mask layer pattern 106a may also be removed.

Therefore, as illustrated in FIG. 1B, the damascene stitch pattern SP (in which the divided first damascene pattern 110 and second damascene pattern 118 overlap and connect to each other) may be formed.

Figure 2I:
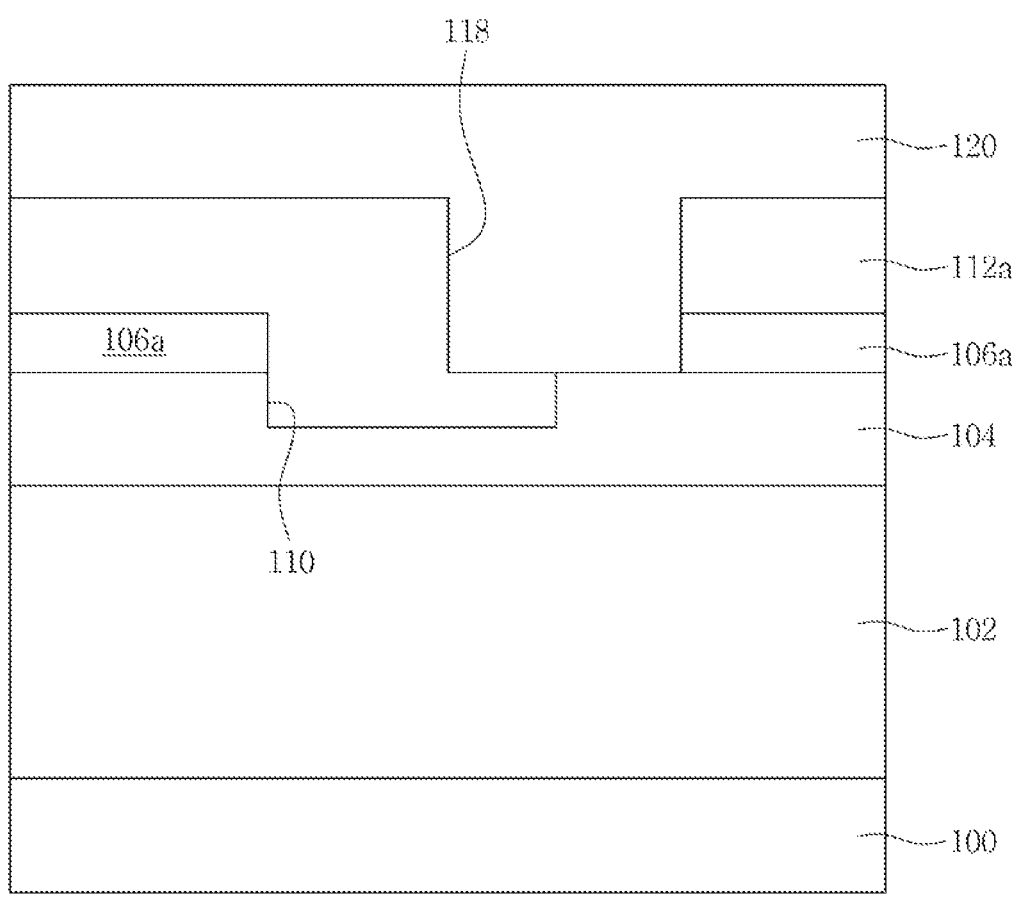

Referring to FIG. 2I, a third damascene mask layer 120 may be formed on the second damascene mask layer pattern 112a to bury or fill the second damascene pattern 118.

The third damascene mask layer 120 may be in contact with the second damascene mask layer pattern 112a and the first damascene mask layer 104 through the second damascene pattern 118.

The third damascene mask layer 120 may include a material having a similar etch property with respect to the first damascene mask layer 104 and the second damascene mask layer 112, e.g., may include a carbon-containing layer such as SOH. The third damascene mask layer 120 may be formed through a spin coating process.

In the etching process of forming the second damascene pattern 118 (as described in FIG. 2G), the second damascene mask layer 112 of the damascene stitch pattern SP could be over-etched due to a difference in etch selectivity between the second damascene mask layer 112 and the first mask layer pattern 106a therebelow. At this time, the molding layer 102 of the damascene stitch pattern SP could be over-etched along the over-etched profile of the second damascene mask layer 112 in a subsequent trench etching process. Thus, an undesirable electrical short between a damascene wiring and a conductive structure therebelow could occur.

According to an embodiment, even if when the over-etching of the second damascene mask layer 112 (caused by the etching process for forming the second damascene pattern 118) were to occur, the second damascene pattern 118 may be buried or filled with the third damascene mask layer 120 to compensate for the over-etched portion of the second damascene mask layer 112.

Figure 2J:
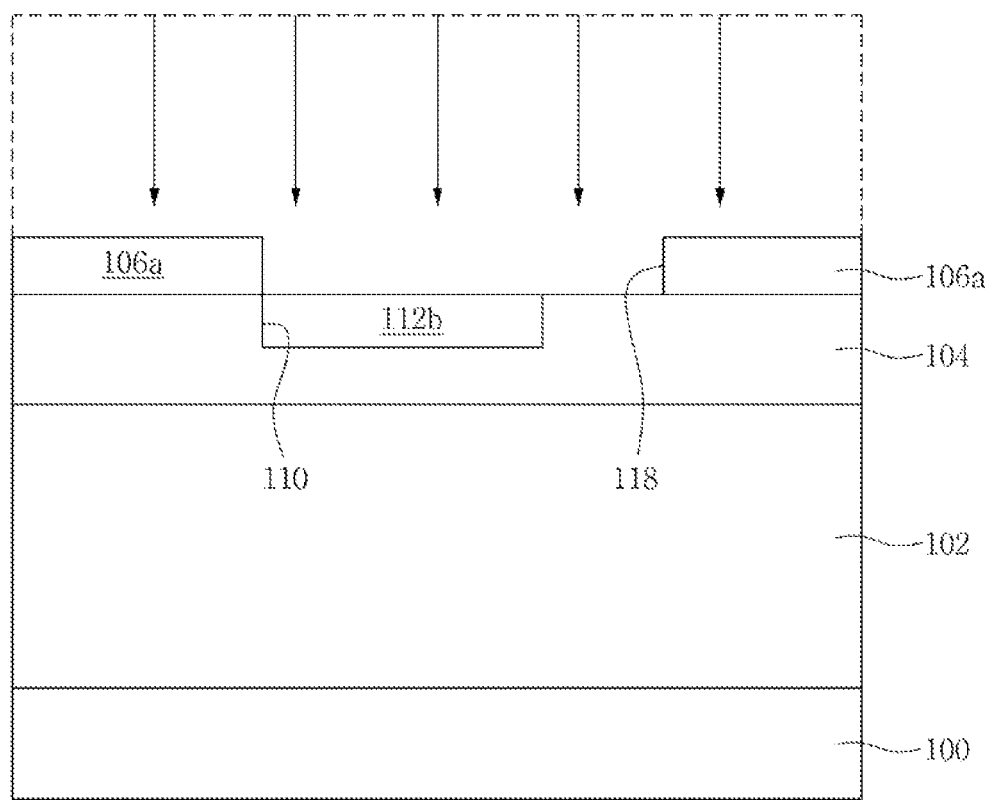

Referring to FIG. 2J, the third damascene mask layer 120 and the second damascene mask layer pattern 112a may be etched down to a surface of the first mask layer pattern 106a. The etching process may be performed using an etch-back process.

The third damascene mask layer 120 may be removed, and portions of the second damascene mask layer pattern 112a may remain only in the first damascene pattern 110 by the etching process. Hereinafter, the remaining second damascene mask layer pattern is indicated by the reference numeral 112b.

Figure 2K:
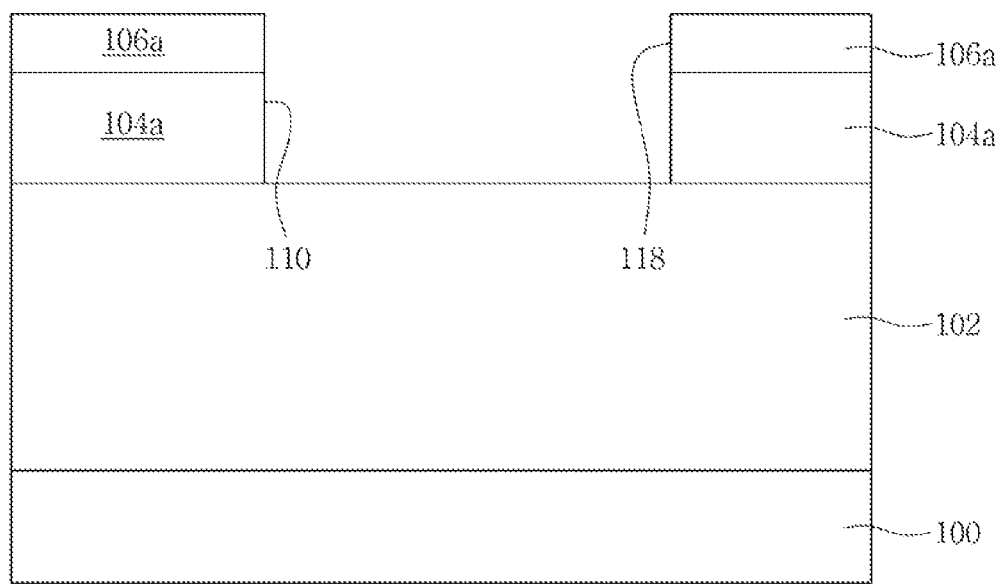

Referring to FIG. 2K, the first damascene mask layer 104 may be etched using the first mask layer pattern 106a as an etch mask to form the first damascene mask layer pattern 104a (exposing the molding layer 102 therebelow).

Remaining portions of the second damascene mask layer pattern 112b in the first damascene pattern 110 may have the same etch property as or a similar etch property with respect to the first damascene mask layer 104, and the remaining portions of the second damascene mask layer pattern 112b may be etched and removed together with the first damascene mask layer 104 in the etching process of the first damascene mask layer 104.

Figure 2L:
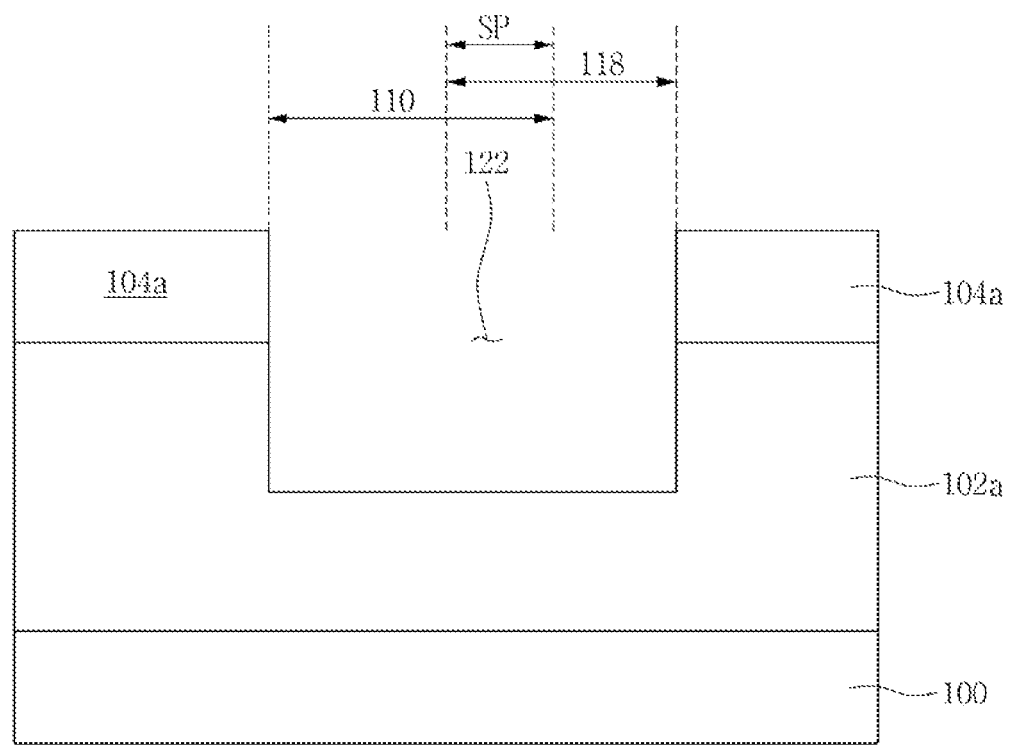

Referring to FIG. 2L, the exposed area of the molding layer 102 may be etched using the first damascene mask layer pattern 104a as an etch mask to form a molding layer pattern 102a having a trench 122 extending from the first and second damascene patterns 110 and 118.

The portions of the molding layer 102 exposed by the first damascene mask layer pattern 104a may be etched to a uniform depth to form the trench 122 having a flat bottom.

When the molding layer 102 is etched, the first mask layer pattern 106a may also be removed.

Figure 2M:
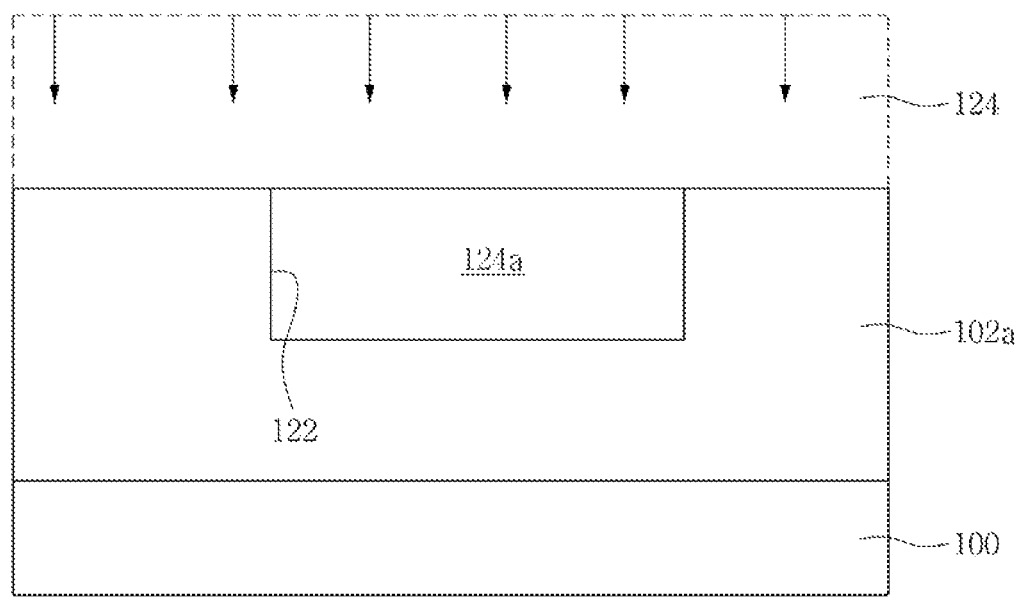

Referring to FIG. 2M, the first damascene mask layer pattern 104a may be removed.

A conductive layer 124 may be formed on the molding layer pattern 102a to bury or fill the trench 122. The conductive layer 124 may include, e.g., a metal such as aluminum (Al), copper (Cu), tungsten (W), titanium (Ti), or tantalum (Ta), or an alloy such as titanium tungsten (TiW) or titanium aluminum (TiAl).

Portions of the conductive layer 124 may be removed down to a surface of the molding layer pattern 102a through a chemical mechanical polishing (CMP) process or an etch-back process to form a damascene wiring 124a in the trench 122. As illustrated in FIG. 1A, the damascene wiring 124a may be repeatedly arranged at the fine first pitch p1 in the one region, and may be repeatedly arranged at the second pitch p2 (that is larger than the first pitch p1) in the other region.

According to an embodiment, after all the divided first and second damascene patterns 110 and 118 are formed, the third damascene mask layer 120 may be formed on the first and second damascene patterns 110 and 118.

The etching processes for forming the trench 122 (in which the damascene wiring 124a is to be formed) may be performed in a state in which the first and second damascene patterns 110 and 118 are buried or filled with the second damascene mask layer pattern 112a and the third damascene mask layer 120. The etching of the molding layer 102 to provide the shape of the damascene wiring 124a may be uniformly performed, and the over-etching of the damascene stitch pattern SP (in which the divided first and second damascene patterns 110 and 118 overlap each other) may not occur.

The trench 122 may be etched to a uniform depth to have a flat bottom, and the molding layer 102 may not remain inside the trench 122

Therefore, process failures (such as an electrical short between the damascene wiring 124a and an underlying conductive structure) and a burying failure of the damascene wiring 124a be reduced and/or prevented.

FIGS. 3A to 3G illustrate cross-sectional views of stages in a method of manufacturing a semiconductor device according to an embodiment, taken along line I-I' of FIG. 1B.

Figure 3A:
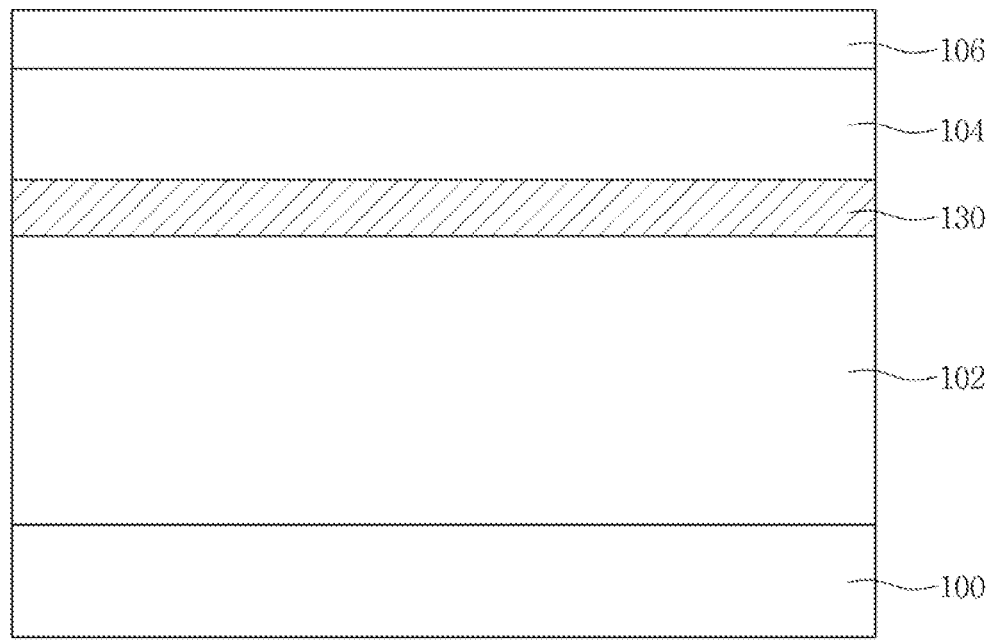
FIGS. 3A to 3G illustrate cross-sectional views of stages in a method of manufacturing a semiconductor device according to an embodiment.

Referring to FIG. 3A, a molding layer 102 may be formed on a substrate 100.

The substrate 100 may be a semiconductor substrate, such as silicon (Si), silicon germanium (SiGe), germanium (Ge), gallium arsenic (GaAs), or silicon on insulator (SOI). The substrate 100 may include a conductive layer or an insulating layer. The substrate 100 may further include a conductive structure such as a word line, or semiconductor devices.

The molding layer 102 may be a layer configured to provide a pattern shape according to a damascene process, and may include a selectively etchable material in a subsequent process, e.g., silicon oxide.

A metallic hard mask layer 130 may be formed on the molding layer 102. The metallic hard mask layer 130 may be a layer for improving etch selectivity with respect to the molding layer 102 therebelow, and may include a metallic or metal-containing material deposited at a low temperature (e.g., about 270° C. or less) process, for example, titanium nitride (TiN).

A first damascene mask layer 104 and a first mask layer 106 may be sequentially formed on the metallic hard mask layer 130.

The first damascene mask layer 104 may be provided as a hard mask layer for etching the molding layer 102. The first damascene mask layer 104 may be formed of a material having etch selectivity with respect to the molding layer 102 therebelow. For example, the first damascene mask layer 104 may be formed of a carbon-containing layer such as a SOH layer. The SOH layer may be formed through a spin coating layer.

In addition to a hard mask function for etching the first damascene mask layer 104, the first mask layer 106 may help prevent a light source from being scattered in an exposure process for forming a photoresist pattern, and may be provided as an ARL for improving a profile of the photoresist pattern. The first mask layer 106 may be formed of a material having etch selectivity with respect to the first damascene mask layer 104. For example, the first mask layer 106 may include SiON.

Figure 3B:
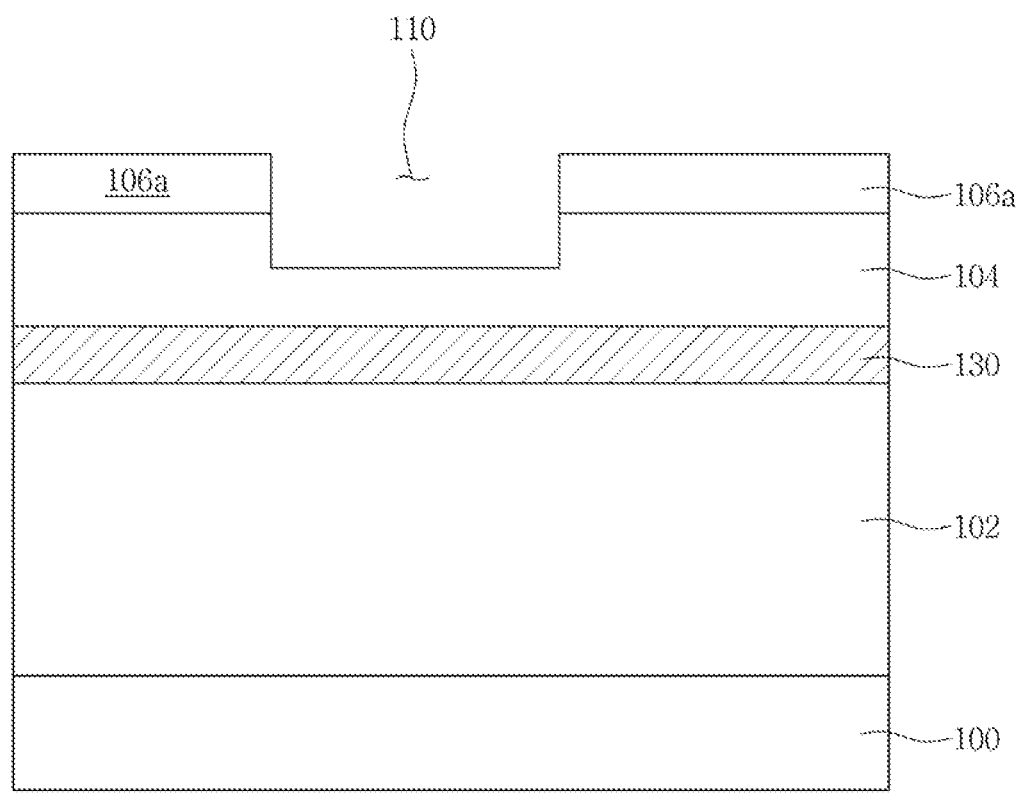

Referring to FIG. 3B, the first mask layer 106 may be etched through a photolithographic process to form a first mask layer pattern 106a.

Subsequently, the first damascene mask layer 104 may be partially etched using the first mask layer pattern 106a as an etch mask to form a first damascene pattern 110.

Figure 3C:
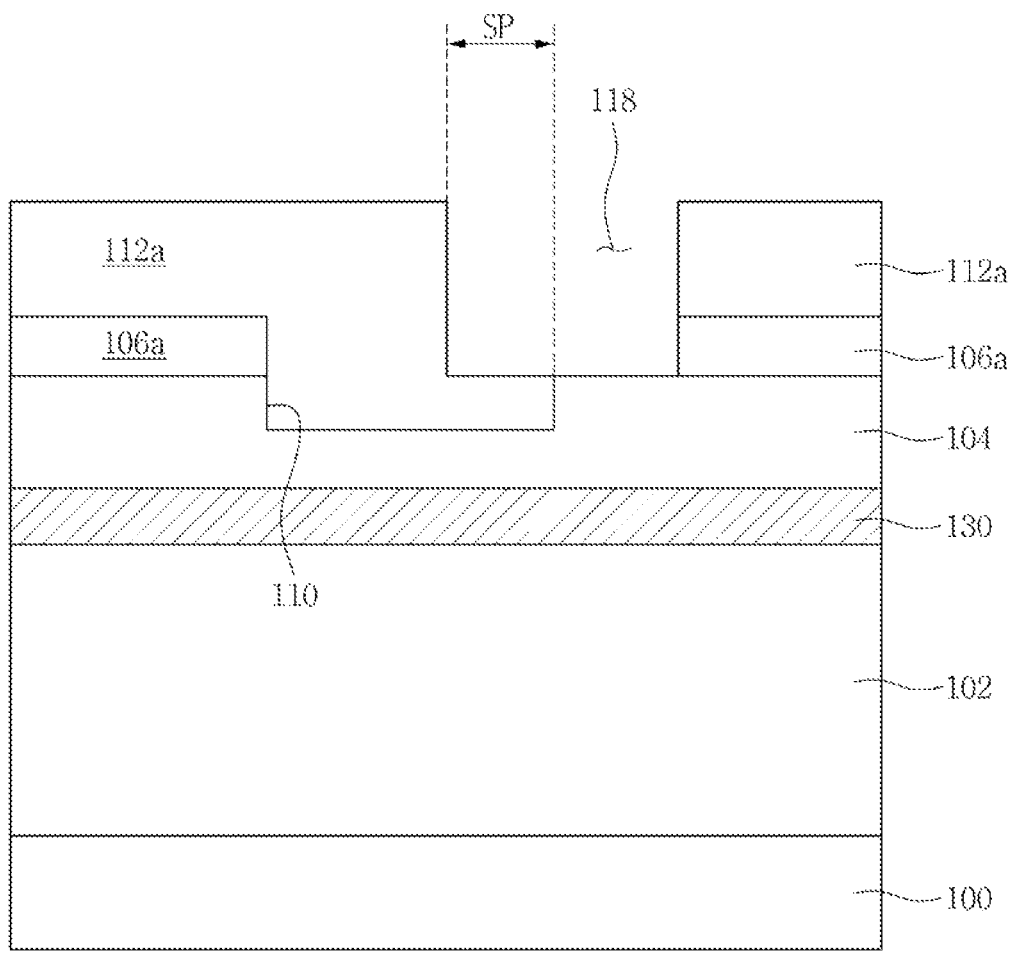

Referring to FIG. 3C, a second damascene mask layer 112 may be formed on the first mask layer pattern 106a to bury or fill the first damascene pattern 110.

The second damascene mask layer 112 may include a material having a similar etch property with respect to the first damascene mask layer 104, e.g., a carbon-containing layer such as SOH. The second damascene mask layer 112 may be formed through a spin coating process.

Subsequently, the second damascene mask layer 112 may be etched by performing the processes described with reference to FIGS. 2F to 2H to form a second damascene pattern 118. As illustrated in FIG. 1B, the second damascene pattern 118 may partially overlap the first damascene pattern 110.

The etching process of the second damascene mask layer 112 may be performed to be completed at a surface of the first mask layer pattern 106a. Through the etching process for forming the second damascene pattern 118, a second damascene mask layer pattern 112a (burying or filling the first damascene pattern 110 and including the second damascene pattern 118 therein) may be formed.

Subsequently, a portion of the first mask layer pattern 106a (along with portions of the second damascene mask layer pattern 112a) exposed by the second damascene pattern 118 may be removed. Therefore, as illustrated in FIG. 1B, a damascene stitch pattern SP (in which the divided first damascene pattern 110 and second damascene pattern 118 overlap and connect to each other) may be formed.

Figure 3D:
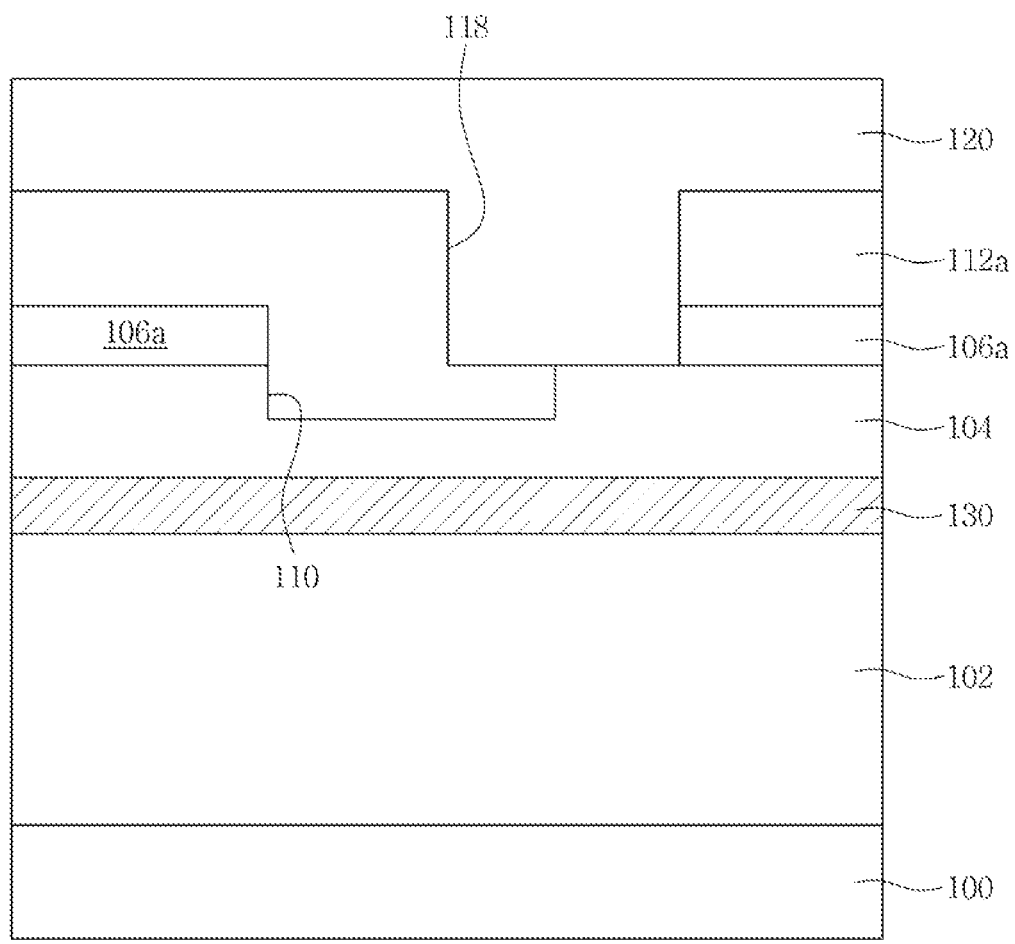

Referring to FIG. 3D, a third damascene mask layer 120 may be formed on the second damascene mask layer pattern 112a to bury or fill the second damascene pattern 118.

The third damascene mask layer 120 may be in contact with the second damascene mask layer pattern 112a and the first damascene mask layer 104 through the second damascene pattern 118.

The third damascene mask layer 120 may include a material having a similar etch property with respect to the first damascene mask layer 104 and the second damascene mask layer 112, e.g., a carbon-containing layer such as SOH. The third damascene mask layer 120 may be formed through a spin coating process.

Figure 3E:
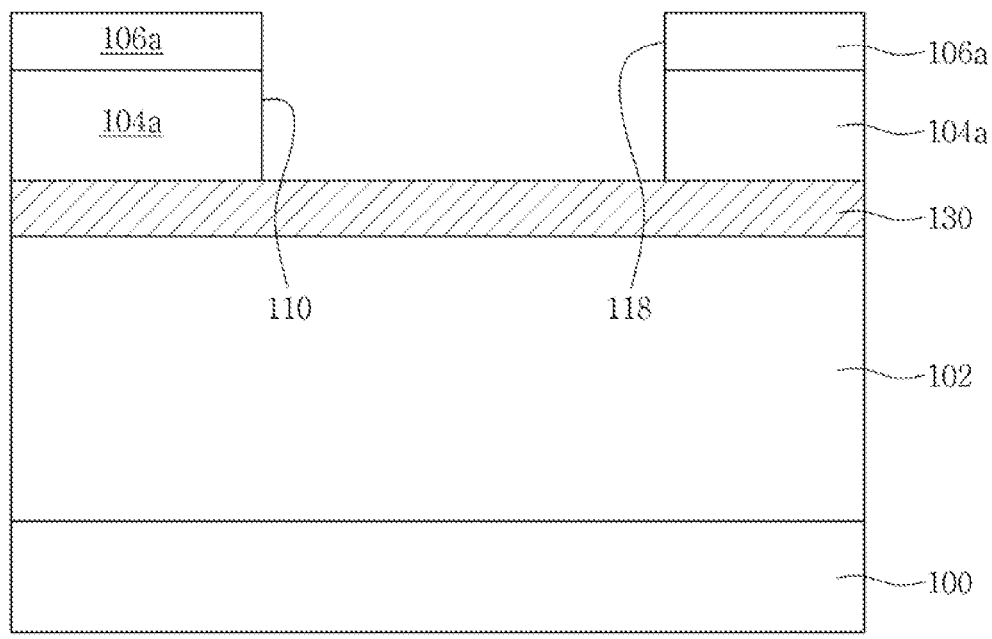

Referring to FIG. 3E, the third damascene mask layer 120 and the second damascene mask layer pattern 112a may be etched down to a surface of the first mask layer pattern 106a or the first damascene mask layer 104. The etching process may be performed using an etch-back process.

The third damascene mask layer 120 may be removed, and the second damascene mask layer pattern 112a may be left only in the first damascene pattern 110 through the etching process.

Subsequently, the first damascene mask layer 104 may be etched using the first mask layer pattern 106a as an etch mask to form the first damascene mask layer pattern 104a that exposes the metallic hard mask layer 130 therebelow.

The remaining portions of the second damascene mask layer pattern 112a in the first damascene pattern 110 may have the same etch property as or a similar etch property with respect to the first damascene mask layer 104, and the remaining second damascene mask layer pattern 112a may be etched and removed together with the first damascene mask layer 104 in the etching process of the first damascene mask layer 104.

Figure 3F:
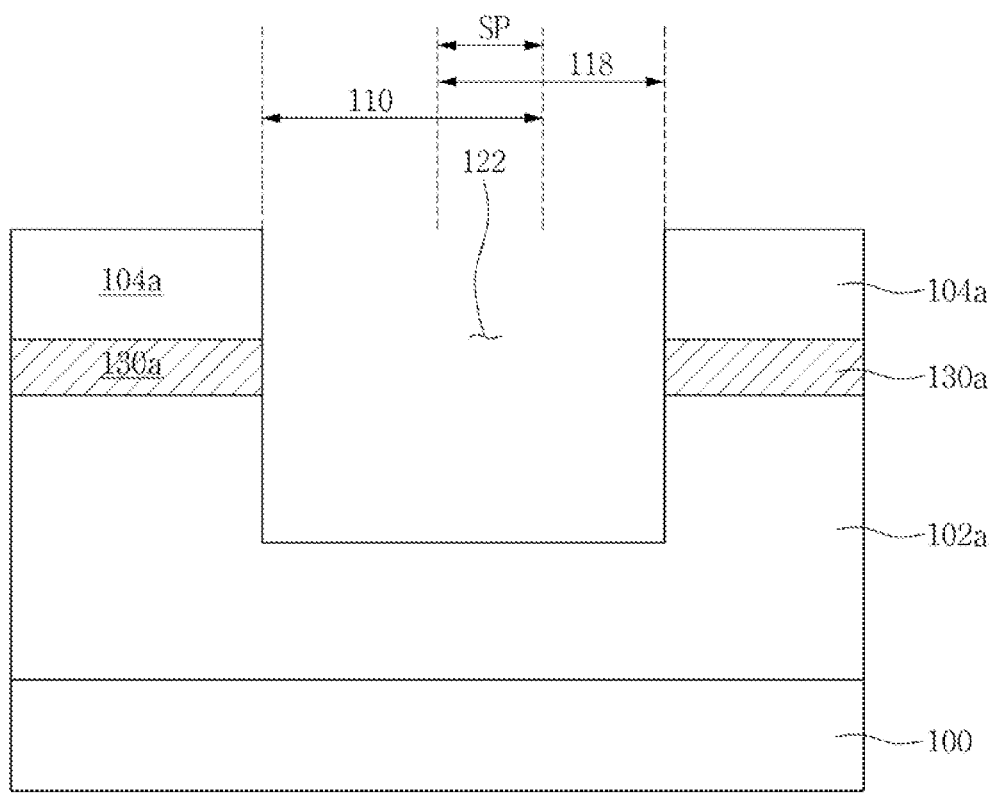

Referring to FIG. 3F, the metallic hard mask layer 130 may be etched using the first damascene mask layer pattern 104a as an etch mask to form a metallic hard mask layer pattern 130a that exposes the molding layer 102 therebelow.

Subsequently, the exposed portions of the molding layer 102 may be etched using the metallic hard mask layer pattern 130a as an etch mask to form a molding layer pattern 102a having a trench 122 extending from the first and second damascene patterns 110 and 118. The metallic hard mask layer pattern 130a may have high etch selectivity to the molding layer 102, and the molding layer pattern 102a having the trench 122 with a good profile may be formed.

When the molding layer 102 is etched, the first mask layer pattern 106a may also be removed.

Figure 3G:
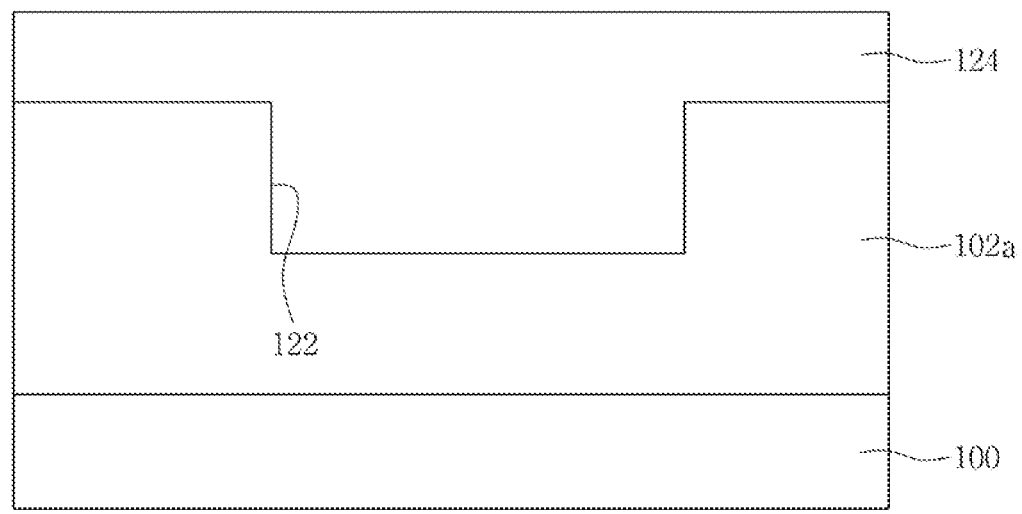

Referring to FIG. 3G, the first damascene mask layer pattern 104a and the metallic hard mask layer pattern 130a may be removed.

A conductive layer 124 may be formed on the molding layer pattern 102a to bury or fill the trench 122. The conductive layer 124 may include a metal such as Al, Cu, W, Ti, or Ta, or an alloy such as TiW or TiAl.

Subsequently, a damascene wiring 124a may be formed inside of the trench 122 by performing the process described with reference to FIG. 2M. As illustrated in FIG. 1A, the damascene wiring 124a may be repeatedly arranged at the fine first pitch p1 in the one region, and may be repeatedly arranged at the second pitch p2 (that is larger than the first pitch p1) in the other region.

Figure 4B:
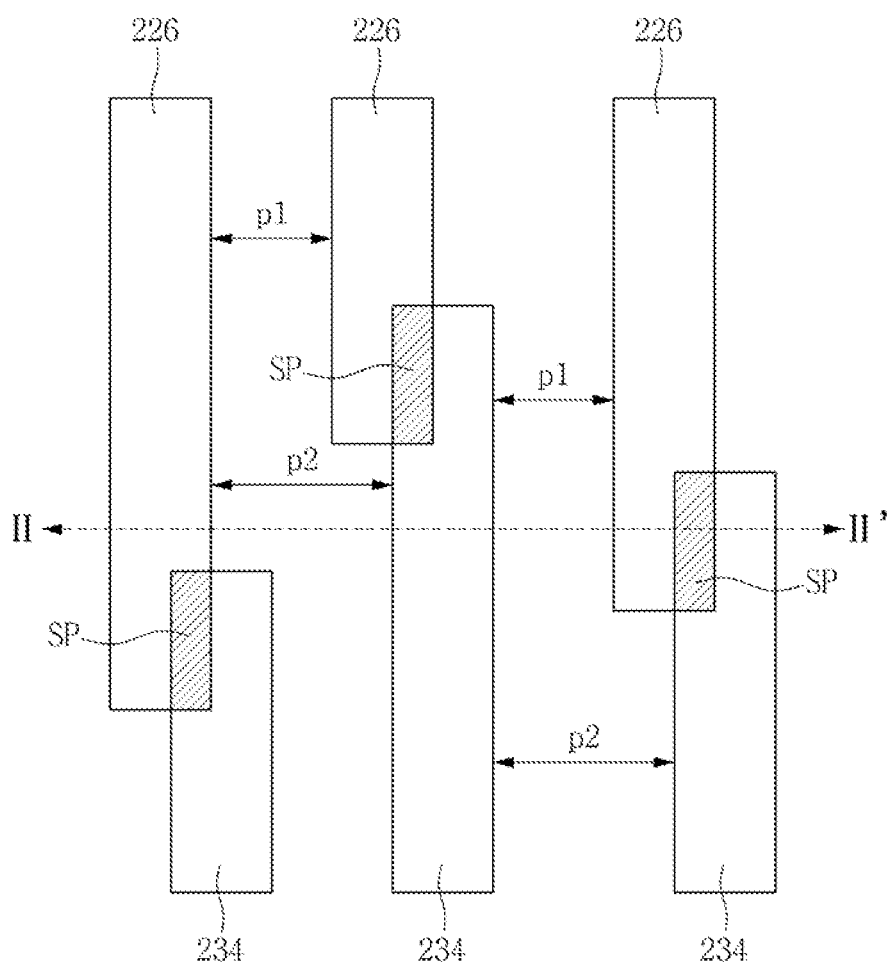
FIG. 4B illustrates a plan view of a damascene pattern for forming the bit line of FIG. 4A.

FIG. 4A illustrates a plan view of a bit line of a semiconductor device according to an embodiment. FIG. 4B illustrates a plan view of a damascene pattern for forming the bit line of FIG. 4A.

Referring to FIGS. 4A and 4B, a semiconductor device according to an embodiment may be a magnetic random access memory (MRAM) that implements a memory function using resistance change according to polarity change of a magnetic material.

The MRAM device may include a cell array region (in which a plurality of MRAM cells electrically connected to word lines and bit lines are formed) and a core/peripheral circuit region (configured to control the MRAM cells).

Bit lines 240b formed on the core/peripheral circuit region may be repeatedly arranged at a fine first pitch p1 in one region, and repeatedly arranged at a second pitch p2 (larger than the first pitch p1) in another region.

Cell bit lines 240a formed on the cell array region may be repeatedly arranged in the same pattern. The cell bit lines 240a may be repeatedly arranged at a third pitch p3 that is smaller than the first pitch p1.

The bit lines 240a and 240b may be formed using a damascene process to overcome a patterning limitation of a photolithographic process.

The cell bit lines 240a (in which the same pattern is repeated in a very narrow pitch p3) may be formed using double patterning technology (DPT).

The bit lines 240b of the core/peripheral circuit region may be divided into damascene patterns 226 and 234 by performing a photolithographic process and an etching process several times as illustrated in FIG. 4B, and the fine first pitch p1 between the bit lines 240b may be implemented using a damascene stitch pattern SP in which the divided damascene patterns 226 and 234 overlap each other.

FIGS. 5A to 5M illustrate cross-sectional views of stages in a method of manufacturing a semiconductor device according to an embodiment, taken along line II-II' of FIG. 4B.

Figure 5A:
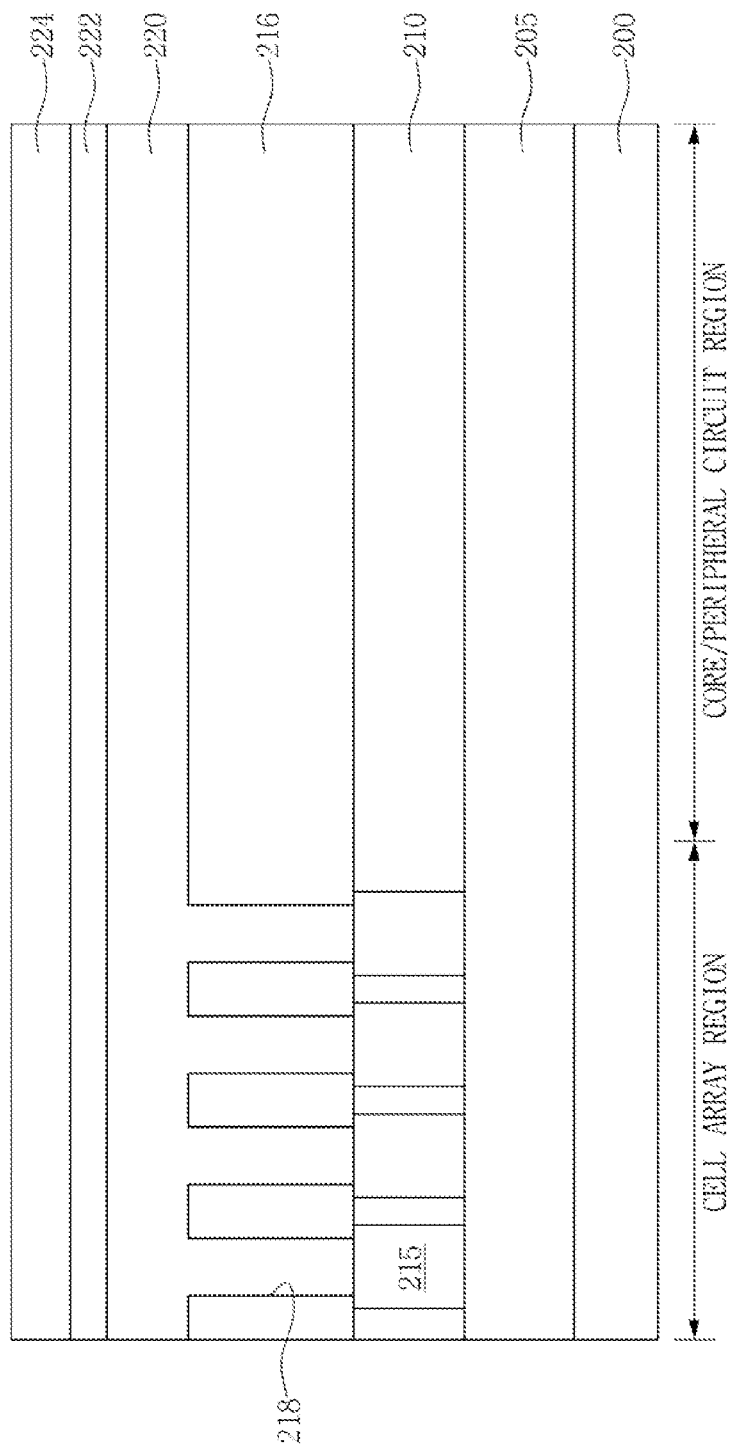

Referring to FIG. 5A, a substrate 200 may be provided.

The substrate 200 may be a semiconductor substrate, e.g., silicon (Si), silicon germanium (SiGe), germanium (Ge), gallium arsenic (GaAs), or silicon on insulator (SOI).

The substrate 200 may include a cell array region (in which a plurality of MRAM cells are formed) and a core/peripheral circuit region (configured to control the MRAM cells). Each of the MRAM cells may include a gate structure (not shown)

on the substrate 200 and a magnetic memory pattern 215 electrically connected to the gate structure and configured to perform a memory function by magneto-resistance.

The magnetic memory pattern 215 may include a lower magnetic layer, an upper magnetic layer, and a tunnel barrier layer interposed between the lower magnetic layer and the upper magnetic layer. The lower magnetic layer, the tunnel barrier layer, and the upper magnetic layer may constitute a magnetic tunnel junction (MTJ).

A first interlayer insulating layer 205 may be interposed between the gate structure and the magnetic memory pattern 215. A second interlayer insulating layer 210 may be formed on the magnetic memory pattern 215 and the first interlayer insulating layer 205. The first and second interlayer insulating layers 205 and 210 may include, e.g., silicon oxide, silicon nitride, or silicon oxynitride.

A molding layer 216 may be formed on the second interlayer insulating layer 210. The molding layer 216 may provide a bit line pattern shape according to a damascene process, and may include a selectively etchable material for a subsequent process, e.g., silicon oxide.

Subsequently, the molding layer 216 of the cell array region may be etched to form cell trenches 218 for forming bit lines connected to MRAM cells.

A first damascene mask layer 220, a first mask layer 222, and a first photoresist layer 224 may be sequentially formed on the molding layer 216 to bury or fill the cell trenches 218.

The first damascene mask layer 220 may be provided as a hard mask layer for etching the molding layer 216. The first damascene mask layer 220 may be formed of a material having etch selectivity with respect to the molding layer 216 therebelow. For example, the first damascene mask layer 220 may be formed of a carbon-containing layer such as a SOH layer. The SOH layer may be formed through a spin coating process.

In addition to a hard mask function for etching the first damascene mask layer 220, the first mask layer 222 may help prevent a light source from being scattered in an exposure process for forming a photoresist pattern, and may be provided as an ARL for improving a profile of the photoresist pattern. The first mask layer 222 may be formed of a material having etch selectivity with respect to the first damascene mask layer 220. For example, the first mask layer 222 may include SiON.

Figure 5B:
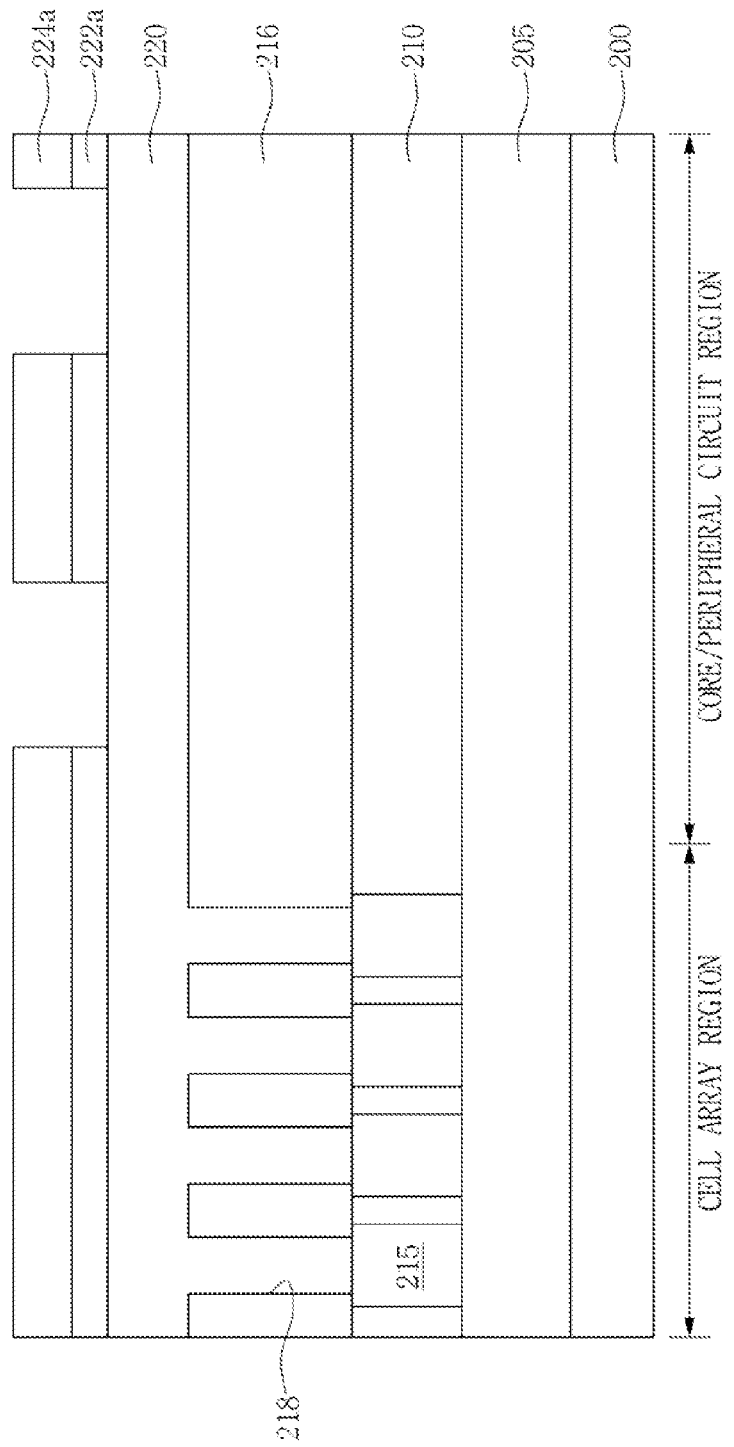

Referring to FIG. 5B, the first photoresist layer 224 may be patterned to form a first photoresist pattern 224a opening or exposing a region in which the first damascene pattern 226 (illustrated in FIG. 4B) is to be formed.

The first mask layer 222 may be etched using the first photoresist pattern 224a as an etching mask to form a first mask layer pattern 222a.

Referring to FIG. 5C, the first damascene mask layer 220 may be partially etched using the first mask layer pattern 222a as an etch mask to form the first damascene pattern 226. When the first damascene mask layer 220 is etched, the first photoresist pattern 224a (having a similar etch property with respect to the first damascene mask layer 220) may also be removed.

Figure 5D:
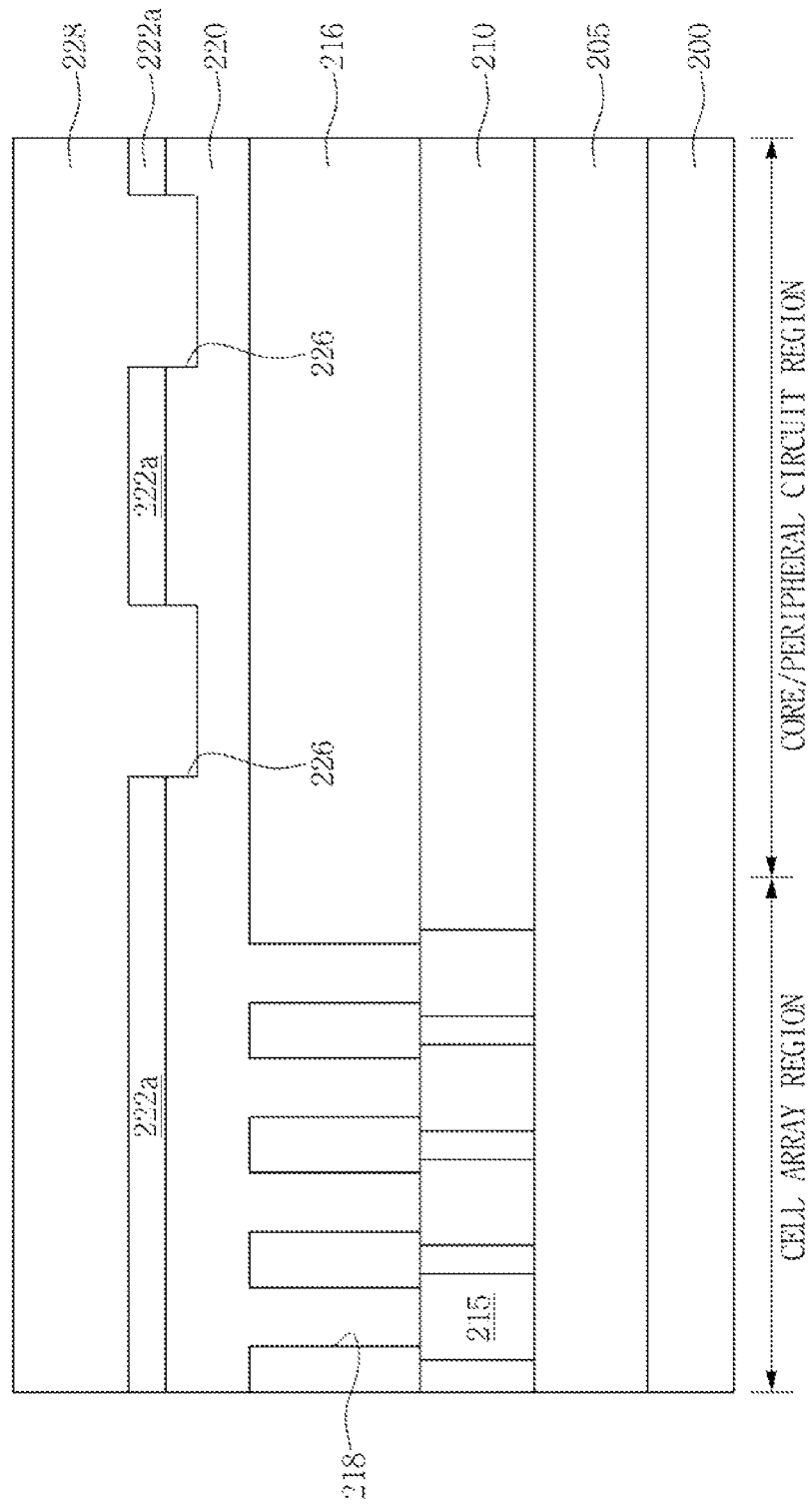

Referring to FIG. 5D, a second damascene mask layer 228 may be formed on the first mask layer pattern 222a to bury or fill the first damascene pattern 226.

The second damascene mask layer 228 may include a material having a similar etch property with respect to the first damascene mask layer 220, e.g., may include a carbon-containing layer such as SOH. The second damascene mask layer 228 may be formed through a spin coating process.

Figure 5E:
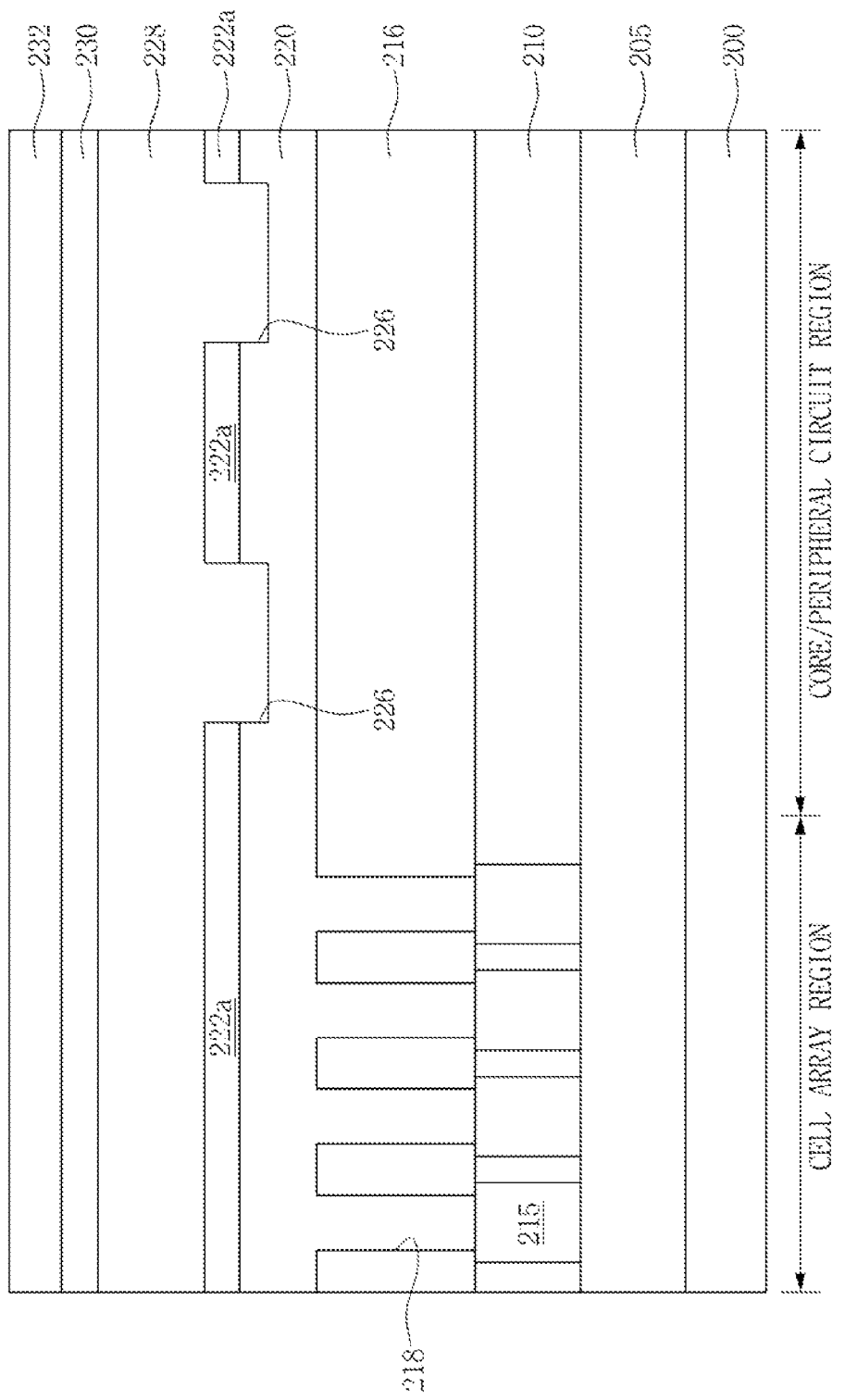

Referring to FIG. 5E, a second mask layer 230 and a second photoresist layer 232 may be sequentially formed on the second damascene mask layer 228.

In addition to a hard mask function for etching the second damascene mask layer 228, the second mask layer 230 may help prevent a light source from being scattered in an exposure process for forming a photoresist pattern, and may be provided as an ARL for improving a profile of the photoresist pattern. The second mask layer 230 may be formed of a material having an etch selectivity with respect to the second damascene mask layer 228, e.g., may include SiON.

Figure 5F:
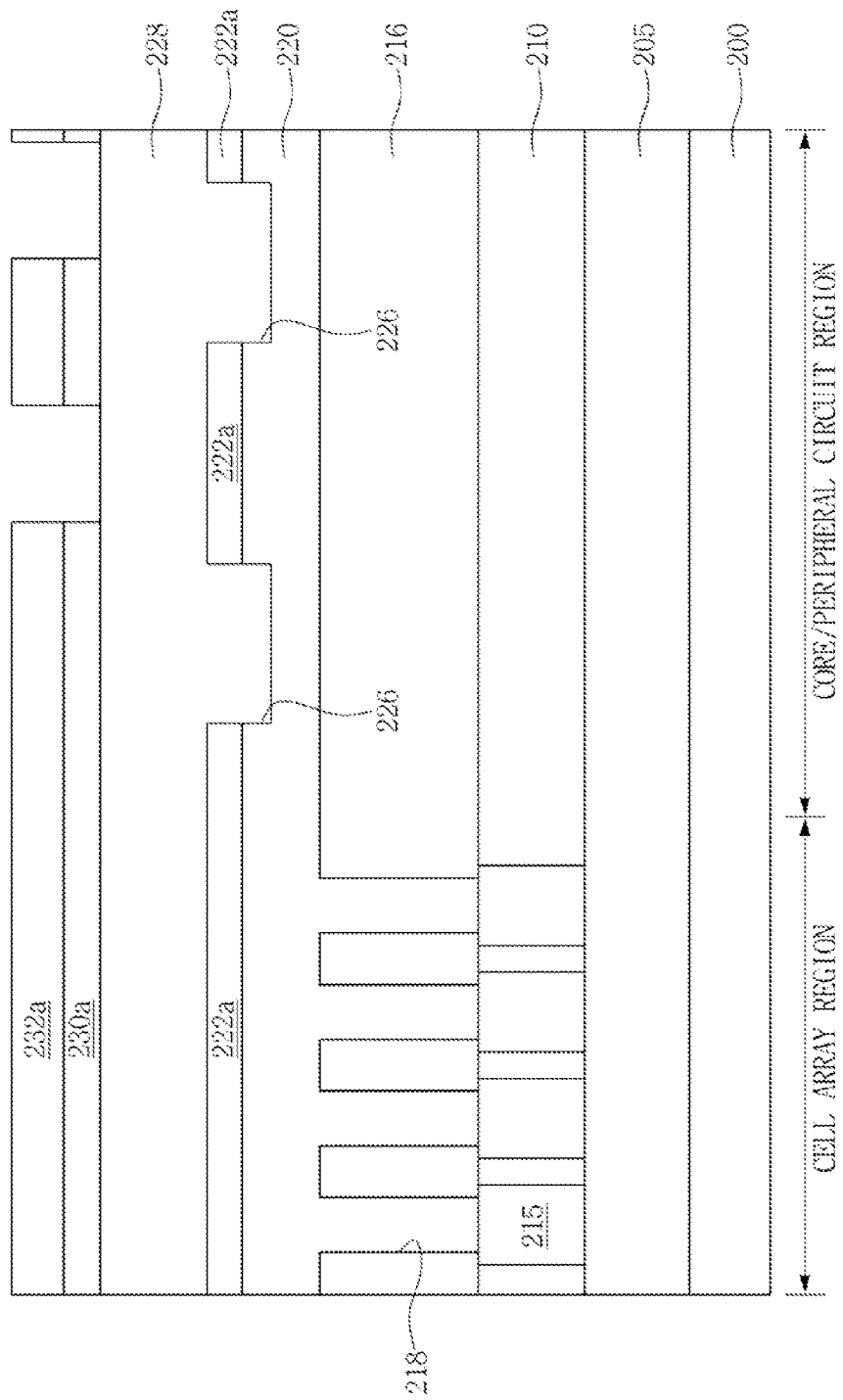

Referring to FIG. 5F, the second photoresist layer 232 may be patterned to form a second photoresist pattern 232a opening or exposing a region in which the second damascene pattern 234 (illustrated in FIG. 4B) is to be formed.

The second mask layer 230 may be etched using the second photoresist pattern 232a as an etch mask to form a second mask layer pattern 230a.

Referring to FIG. 5G, the second damascene mask layer 228 may be etched using the second mask layer pattern 230a as an etch mask to form the second damascene pattern 234.

The etching process of the second damascene mask layer 228 may be performed to be completed on a surface of the first mask layer pattern 222a, e.g., may be performed until the surface of the first mask layer pattern 222a is exposed. When the second damascene mask layer 228 is etched, the second photoresist pattern 232a (having a similar etch property to the second damascene mask layer 228) may be removed.

The second damascene pattern 234 may overlap the first damascene pattern 226, as illustrated in FIG. 4B.

Through the etching process for forming the second damascene pattern 234, a second damascene mask layer pattern 228a (that buries or fills the first damascene pattern 226 and that includes the second damascene pattern 234 therein) may be formed.

Referring to FIG. 5H, a portion of the first mask layer pattern 222a (and portions of the second damascene mask pattern 228a) exposed by the second damascene pattern 234 may be removed.

Therefore, as illustrated in FIG. 4B, a damascene stitch pattern SP (in which the divided first damascene pattern 226 and second damascene pattern 234 overlap and connect to each other) may be formed.

Figure 5I:
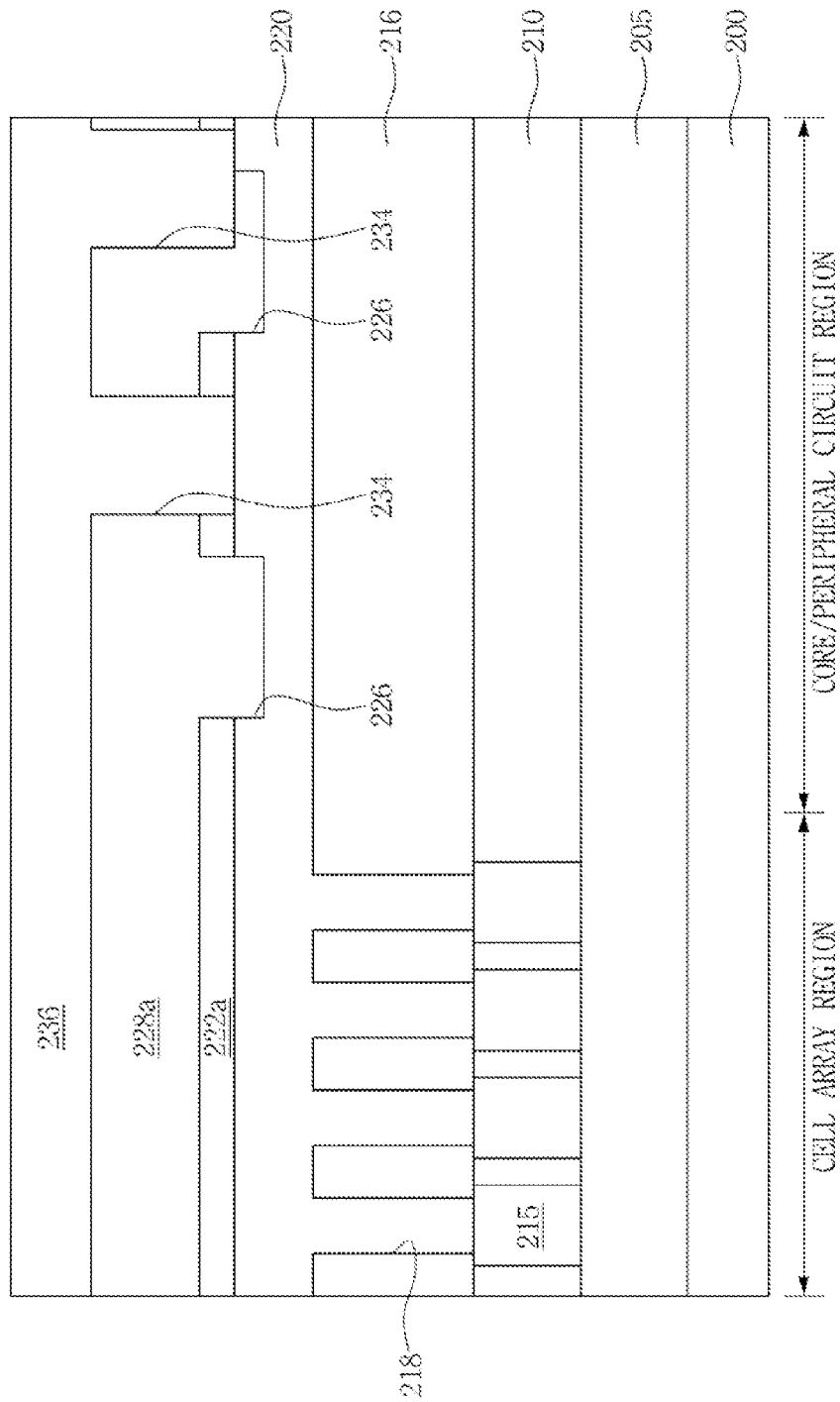

Referring to FIG. 5I, a third damascene mask layer 236 may be formed on the second damascene mask layer pattern 228a to bury or fill the second damascene pattern 234.

The third damascene mask layer 236 may be in contact with the second damascene mask layer pattern 228a and the first damascene mask layer 220 through the second damascene pattern 234.

The third damascene mask layer 236 may include a material having a similar etch property with respect to the first damascene mask layer 220 and the second damascene mask layer 228, e.g., may include a carbon-containing layer such as SOH. The third damascene mask layer 236 may be formed through a spin coating process.

In the etching process of forming the second damascene pattern 234 (as described in FIG. 5G), the second damascene mask layer 228 of the damascene stitch pattern SP could be over-etched due to a difference in etch selectivity between the second damascene mask layer 228 and the first mask layer pattern 222a therebelow. At this time, the molding layer 216 of the damascene stitch pattern SP could be over-etched along the over-etched profile of the second damascene mask layer 228 in a subsequent trench etching process, and thus an electrical short between a damascene bit line and a conductive structure therebelow could occur.

According to an embodiment, even if the over-etching of the second damascene mask layer 228 (caused by the etching process for forming the second damascene pattern 234) were to occur, the second damascene pattern 234 may be buried or filled with the third damascene mask layer 236 to compensate for the over-etched portion of the second damascene mask layer 228.

Referring to FIG. 5J, the third damascene mask layer 236 and the second damascene mask layer pattern 228a may be etched down to a surface of the first mask layer pattern 222a. The etching process may be performed using an etch-back process.

The third damascene mask layer 236 may be removed, and the second damascene mask layer pattern 228a may be left only in the first damascene pattern 226 through the etching process. Hereinafter, the remaining portions of the second damascene mask layer pattern are indicated by the reference numeral 228b.

Referring to FIG. 5K, the first damascene mask layer 220 may be etched using the first mask layer pattern 222a as an etch mask to form the first damascene mask layer pattern 220a exposing the molding layer 216 therebelow.

The remaining portions of the second damascene mask layer pattern 228b in the first damascene pattern 226 may have the same etch property as or a similar etch property with respect to the first damascene mask layer 220, and the remaining portions of the second damascene mask layer pattern 228b may be etched and removed together with the first damascene mask layer 220 in the etching process of the first damascene mask layer 220.

Referring to FIG. 5L, the exposed portions of the molding layer 216 may be etched using the first damascene mask layer pattern 220a as an etch mask to form a molding layer pattern 216a having trenches 238 extending from the first and second damascene patterns 226 and 234.

The molding layer 216 exposed by the first damascene mask layer pattern 220a may be etched to a uniform depth to form the trenches 238 having flat bottoms. In an implementation, a portion of the second insulating layer 210 may be also etched so that the bottoms of the trenches 238 may extend to a portion of the second insulating layer 210.

When the molding layer 216 is etched, the first mask layer pattern 222a may also be removed.

Referring to FIG. 5M, the first damascene mask layer pattern 220a may be removed. As a result, the cell trenches 218 of the cell array region may be opened.

A conductive layer 240 may be formed on the molding layer pattern 216a to bury or fill the trenches 238 and the cell trenches 218. The conductive layer 240 may include a metal such as Al, Cu, W, Ti, or Ta, or an alloy such as TiW or TiAl.

The conductive layer 240 may be removed down to a surface of the molding layer pattern 216a through a CMP process or an etch-back process to form damascene bit lines 240a and 240b inside the cell trenches 218 and the trenches 238.

As illustrated in FIG. 4A, the damascene bit lines 240b in the core/peripheral circuit region may be repeatedly arranged at the fine first pitch p1 in the one region of the substrate 200 and may be repeatedly arranged at the second pitch p2 (that is larger than the first pitch p1) in the other region. The damascene bit lines 240a in the cell array region may have the same pattern shape and may be repeatedly arranged at the very narrow third pitch p3 as illustrated in FIG. 4A.

According to an embodiment, after all the divided first and second damascene patterns 226 and 234 are first formed, the third damascene mask layer 236 may be formed on the first and second damascene patterns 226 and 234.

The etching processes for forming the trenches 238 (in which the damascene bit lines 240b are to be formed) may be performed in a state in which the first and second damascene patterns 226 and 234 are buried or filled with the second damascene mask layer pattern 228a and the third damascene mask layer 236. The etching of the molding layer 216 to provide a shape of the damascene bit line 240b may be uniformly performed, and undesirable over-etching of the damascene stitch pattern SP (in which the divided first and second damascene patterns 226 and 234 overlap each other) may not occur.

The trench 238 may be etched to a uniform depth to have a flat bottom, and the molding layer may not remain inside the trench 238.

Therefore, a process failure (e.g., an electrical short between the damascene bit line 240b and a gate structure therebelow) and/or a burying failure of the damascene bit line 240b may be prevented.

FIGS. 6A to 6G illustrate cross-sectional views of stages in a method of manufacturing a semiconductor device according to an embodiment.

Figure 6A:
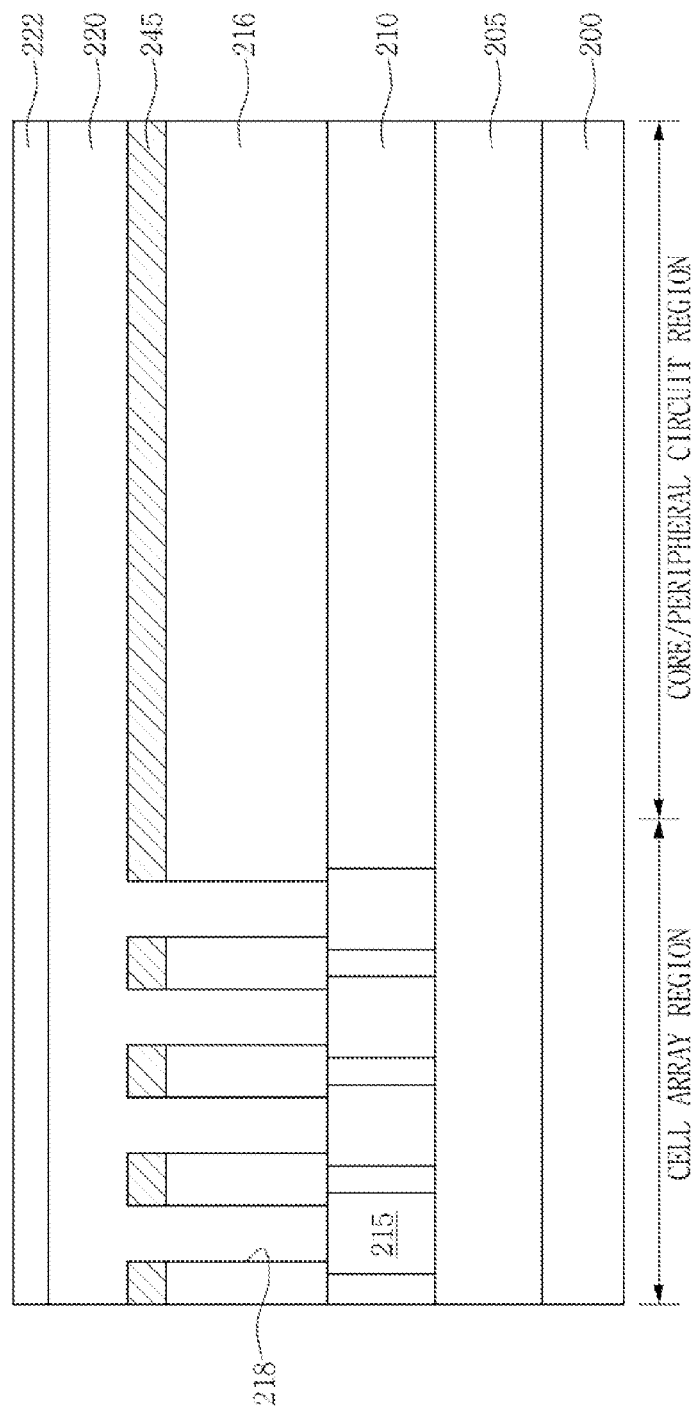

Referring to FIG. 6A, a substrate 200 (including a cell array region in which a plurality of MRAM cells are formed and a core/peripheral circuit region configured to control the MRAM cells) may be prepared.

The substrate 200 may be a semiconductor substrate, such as silicon (Si), silicon germanium (SiGe), germanium (Ge), gallium arsenic (GaAs), or silicon on insulator (SOI).

Each of the MRAM cells may include a gate structure (not shown) on the substrate 200 and a magnetic memory pattern 215 electrically connected to the gate structure.

The magnetic memory pattern 215 may include a lower magnetic layer, an upper magnetic layer, and a tunnel barrier layer interposed between the lower magnetic layer and the upper magnetic layer. The lower magnetic layer, the tunnel barrier layer, and the upper magnetic layer may constitute a magnetic tunnel junction (MTJ).

A first interlayer insulating layer 205 may be interposed between the gate structure and the magnetic memory pattern 215. A second interlayer insulating layer 210 may be on the magnetic memory pattern 215 and the first interlayer insulating layer 205. The first and second interlayer insulating layers 205 and 210 may include, e.g., silicon oxide, silicon nitride, or silicon oxynitride.

A molding layer 216 may be on the second interlayer insulating layer 210. The molding layer 216 may provide a bit line pattern shape according to a damascene process, and may include a selectively etchable material for a subsequent process, e.g., silicon oxide.

A metallic hard mask layer 245 may be formed on the molding layer 216. The metallic hard mask layer 245 may be a layer for improving etch selectivity to the molding layer 216 therebelow, and may include a metallic or metal-containing material deposited at a low temperature (e.g., about 270° C. or less) process, e.g., TiN.

After the cell array region is selectively opened or exposed, the exposed metallic hard mask layer 245 may be etched. The molding layer 216 below or exposed by the metallic hard mask layer 245 may be etched using the etched metallic hard mask layer 245 to form cell trenches 218 for forming bit lines connected to the MRAM cells. The metallic hard mask layer 245 may have high etch selectivity with respect to the molding layer 216, and the cell trenches 218 having a good profile may be formed.

A first damascene mask layer 220 and a first mask layer 222 may be sequentially formed on the metallic hard mask layer 245 to bury or fill the cell trenches 218.

The first damascene mask layer 220 may be provided as a hard mask layer for etching the molding layer 216. The first damascene mask layer 220 may be formed of a material having etch selectivity with respect to the molding layer 216 therebelow. For example, the first damascene mask layer 220 may be formed of a carbon-containing layer such as a SOH layer. The SOH layer may be formed through a spin coating process.

In addition to a hard mask function for etching the first damascene mask layer 220, the first mask layer 222 may help prevent a light source from being scattered in an exposure process for forming a photoresist pattern, and may be provided as an ARL for improving a profile of the photoresist pattern. The first mask layer 222 may be formed of a material having etch selectivity with respect to the first damascene mask layer 220. For example, the first mask layer 222 may include SiON.

Figure 6B:
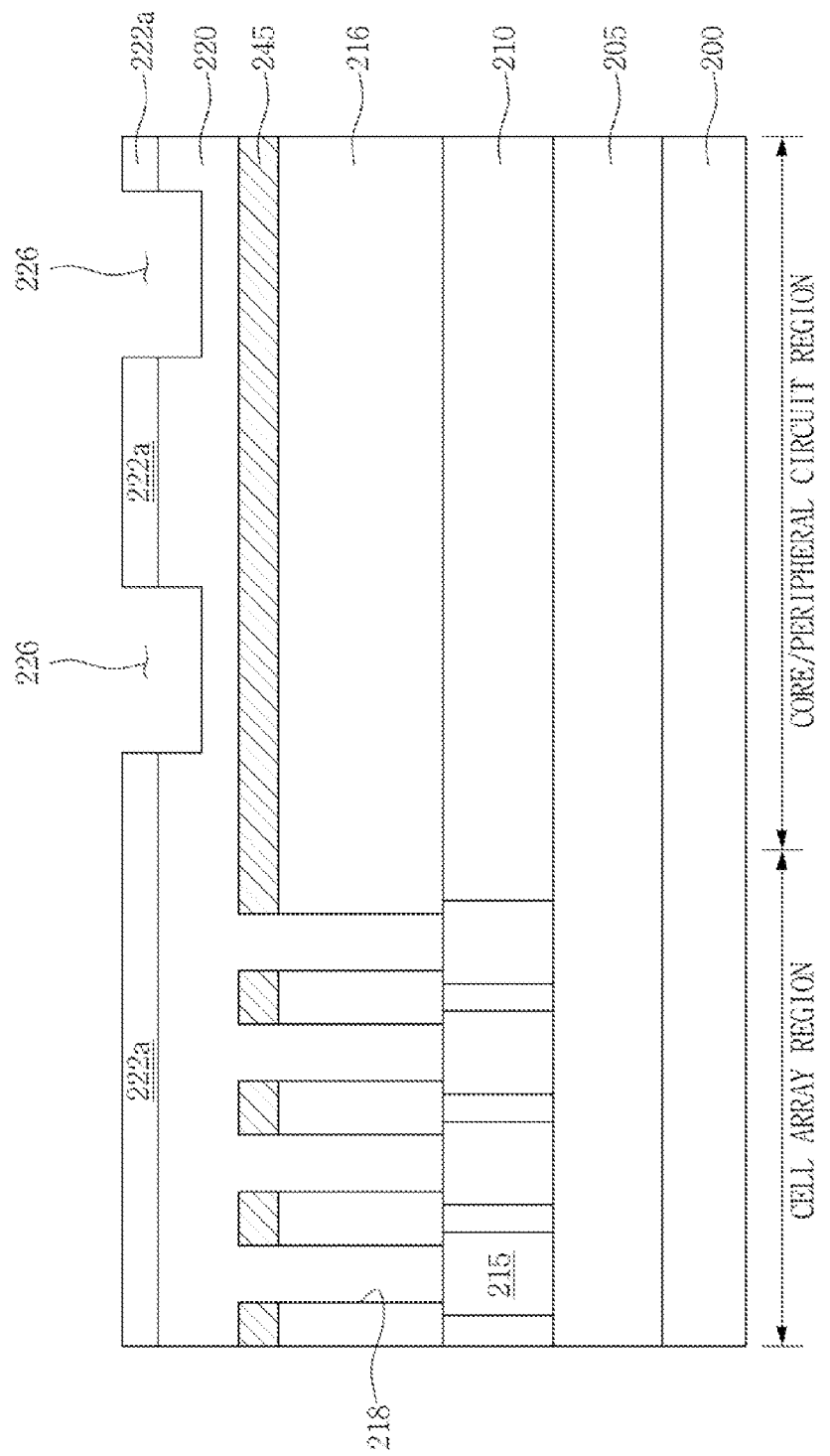

Referring to FIG. 6B, the first mask layer 222 may be etched through a photolithographic process to form a first mask layer pattern 222a.

Subsequently, the first damascene mask layer 220 may be partially etched using the first mask layer pattern 222a as an etch mask to form a first damascene pattern 226.

Figure 6C:
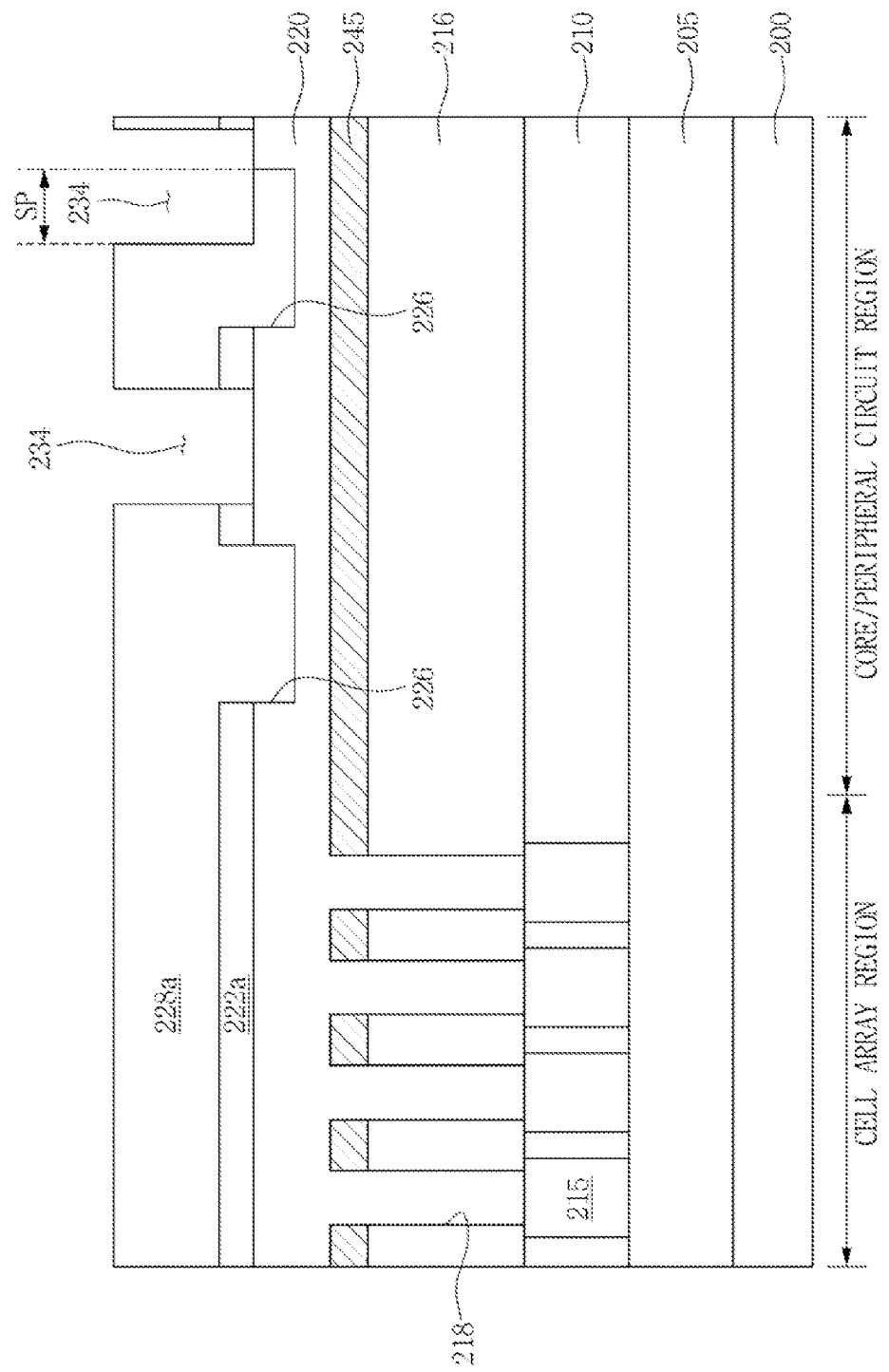

Referring to FIG. 6C, a second damascene mask layer 228 may be formed on the first mask layer pattern 222a to bury or fill the first damascene pattern 226.

The second damascene mask layer 228 may include a material having a similar etch property with respect to the first damascene mask layer 220, e.g., may include a carbon-containing layer such as SOH. The second damascene mask layer 228 may be formed through a spin coating process.

Subsequently, the second damascene mask layer 228 may be etched by performing the processes described with reference to FIGS. 5F to 5H to form a second damascene pattern 234. As illustrated in FIG. 4B, the second damascene pattern 234 may partially overlap the first damascene pattern 226.

Through the etching process for forming the second damascene pattern 234, a second damascene mask layer pattern 228a (burying or filling the first damascene pattern 226 and including the second damascene pattern 234 therein) may be formed.

Subsequently, a portion of the first mask layer pattern 222a exposed by the second damascene pattern 234 may be removed. Therefore, as illustrated in FIG. 4B, a damascene stitch pattern SP (in which the divided first damascene pattern 226 and second damascene pattern 234 overlap and connected to each other) may be formed.

Referring to FIG. 6D, a third damascene mask layer 236 may be formed on the second damascene mask layer pattern 228a to bury or fill the second damascene pattern 234.

The third damascene mask layer 236 may be in contact with the second damascene mask layer pattern 228a and the first damascene mask layer 220 through the second damascene pattern 234.

The third damascene mask layer 236 may include a material having a similar etch property with respect to the first damascene mask layer 220 and the second damascene mask layer 228, e.g., may include a carbon-containing layer such as SOH. The third damascene mask layer 236 may be formed through a spin coating process.

Referring to FIG. 6E, the third damascene mask layer 236 and the second damascene mask layer pattern 228a may be etched down to a surface of the first mask layer pattern 222a. The etching process may be performed using an etch-back process.

The third damascene mask layer 236 may be removed, and portions of the second damascene mask layer pattern 228a may be left only in the first damascene pattern 226 through the etching process. Hereinafter, the remaining portions of the second damascene mask layer pattern are indicated by the reference numeral 228b.

Figure 6F:
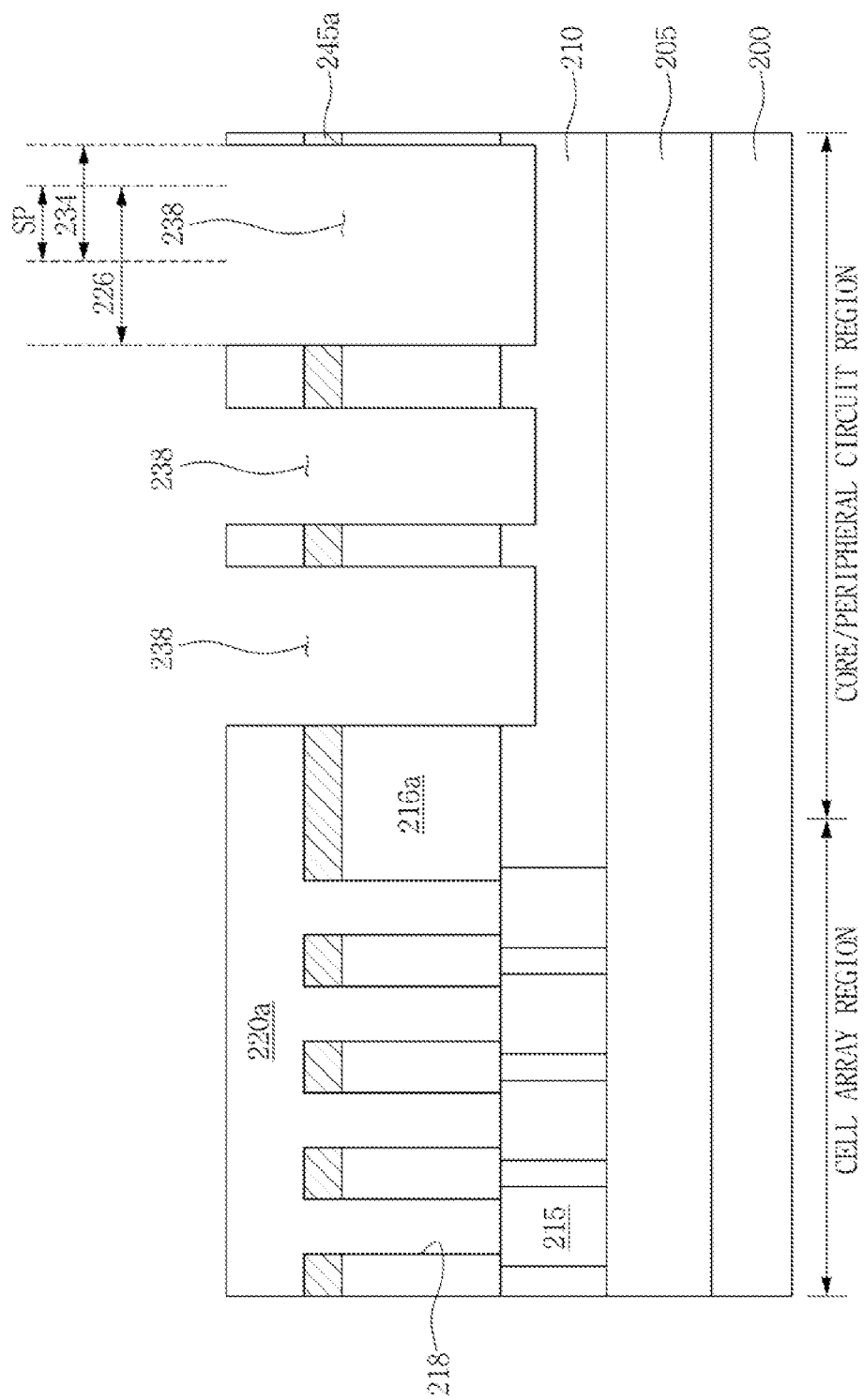

Referring to FIG. 6F, the first damascene mask layer 220 may be etched using the first mask layer pattern 222a as an etch mask to form the first damascene mask layer pattern 220a that exposes the metallic hard mask layer 245 therebelow.

The remaining portions of the second damascene mask layer pattern 228b in the first damascene pattern 226 may have the same etch property as or a similar etch property with respect to the first damascene mask layer 220, and the remaining second damascene mask layer pattern 228b may be etched and removed together with the first damascene mask layer 220 in the etching process of the first damascene mask layer 220.

Subsequently, the metallic hard mask layer 245 may be etched using the first damascene mask layer pattern 220a as an etch mask to form a metallic hard mask layer pattern 245a exposing the molding layer 216 therebelow.

Subsequently, the exposed molding layer 216 may be etched using the metallic hard mask layer pattern 234a as an etch mask to form a molding layer pattern 216a having trenches 238 extending from the first and second damascene patterns 226 and 234. The metallic hard mask layer pattern 245a may have high etch selectivity with respect to the molding layer 216, and the molding layer pattern 216a having the trenches 238 with good profiles may be formed.

When the molding layer 216 is etched, the first mask layer pattern 222a may also be removed.

Figure 6G:
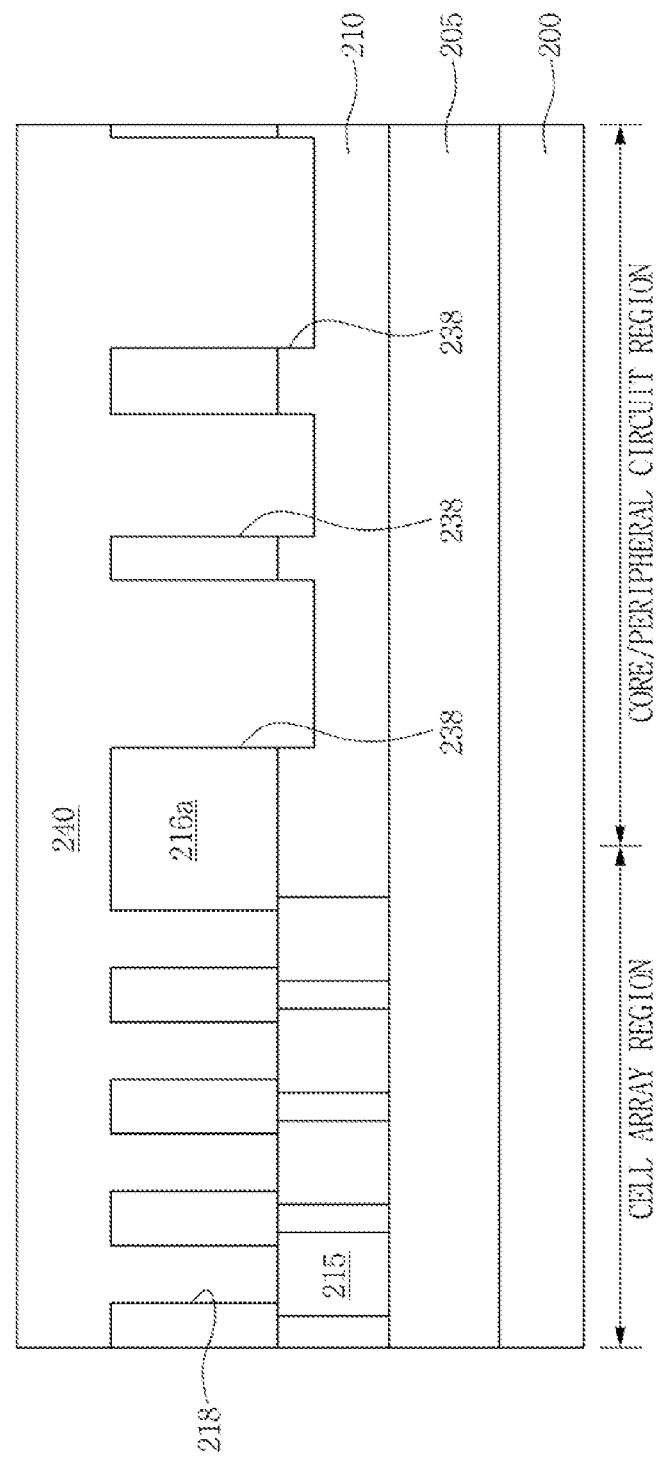

Referring to FIG. 6G, the first damascene mask layer pattern 220a and the metallic hard mask layer pattern 245a may be removed. As a result, the cell trenches 218 of the cell array region may be opened.

A conductive layer 240 may be formed on the molding layer pattern 216a to bury or fill the trenches 238 and cell trenches 218. The conductive layer 240 may be, e.g., a metal such as Al, Cu, W, Ti, or Ta, or an alloy such as TiW or TiAl.

Subsequently, damascene bit lines 240a and 240b may be formed in the cell trenches 218 and the trenches 238 by performing the process described with reference to FIG. 5M.

The damascene bit lines 240a formed in the cell array region may have the same pattern, and may be repeatedly arranged at the very narrow third pitch p3 as illustrated in FIG. 4A. As illustrated in FIG. 4A, the damascene bit lines 240b formed in the core/peripheral circuit region may be repeatedly arranged at the fine first pitch p1 in the one region of the substrate 200, and may be repeatedly arranged at the second pitch p2 larger than the first pitch p1 in the other region.

Figure 7:
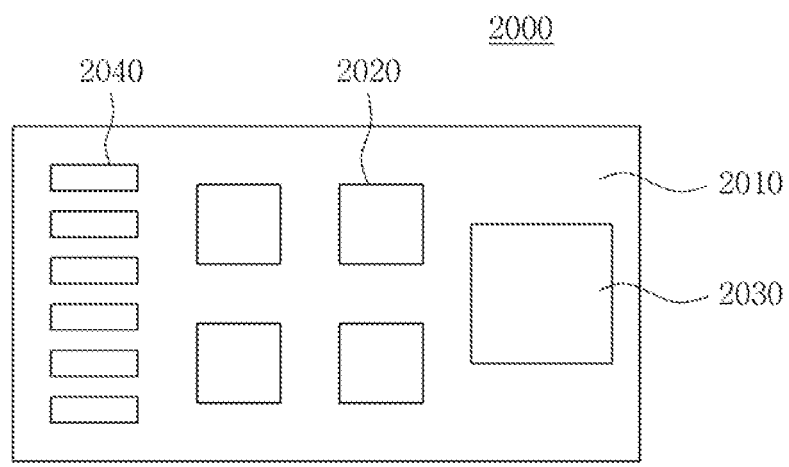
FIG. 7 illustrates a schematic diagram of a semiconductor module having a semiconductor device according to various embodiments.

FIG. 7 illustrates a block diagram of a semiconductor module including semiconductor devices according to various embodiments.

Referring to FIG. 7, a semiconductor module 2000 including a control unit 2020, a storage unit 2030, and input/output units 2040 disposed on a module substrate 2010 may be provided.

The module substrate 2010 may include a printed circuit board (PCB).

The control unit 2020 may include a logic device such as a controller.

The storage unit 2030 may include a memory device such as a dynamic random access memory (DRAM), a magnetic RAM (MRAM), or a NAND flash memory.

The input/output units 2040 may include conductive terminals.

Any one of the control unit 2020 and the storage unit 2030 may include semiconductor devices according to various embodiments.

The semiconductor module 2000 may be a memory card such as a solid state disc (SSD).

Figure 8:
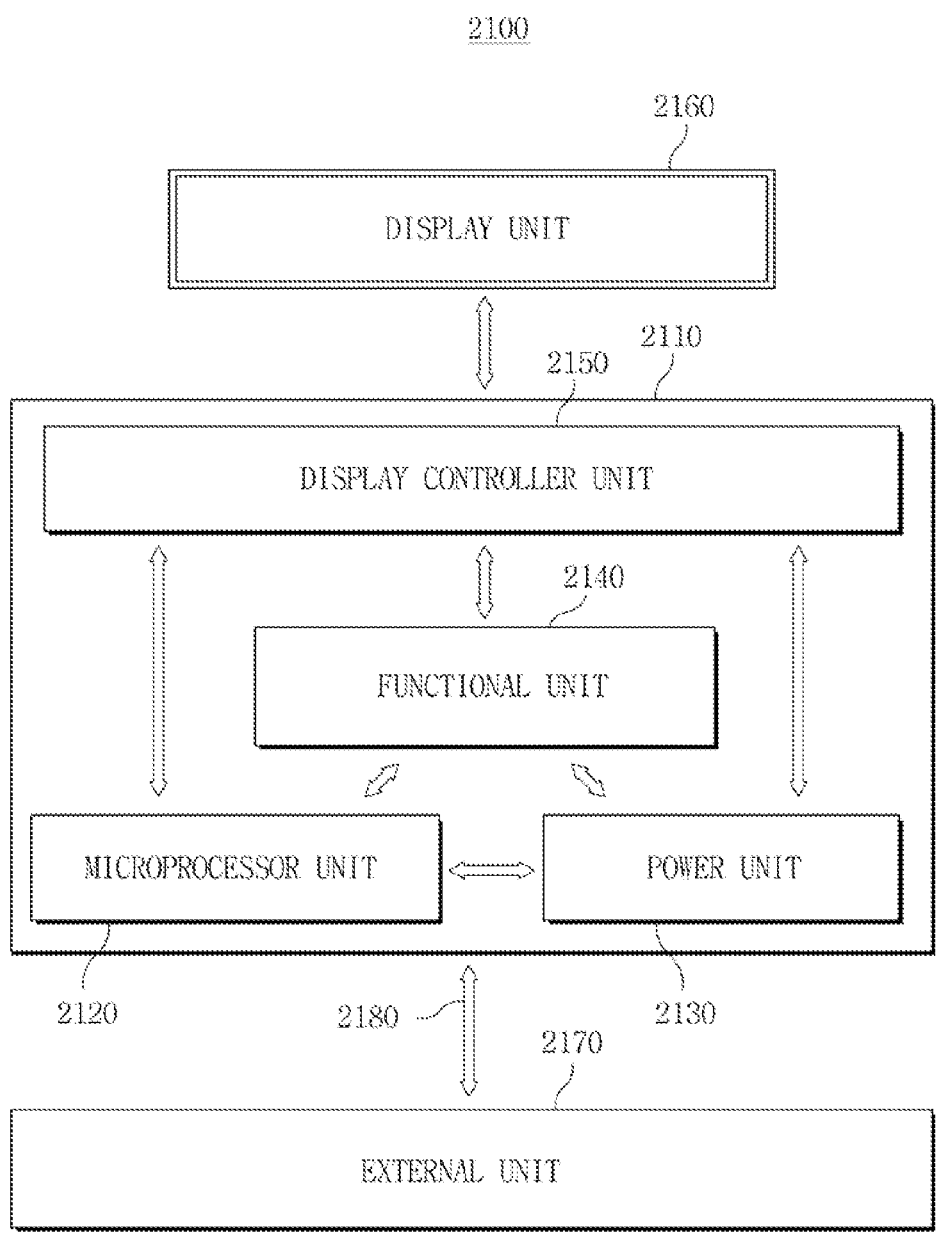
FIG. 8 illustrates a block diagram of an electronic system having a semiconductor device according to various embodiments.

FIG. 8 illustrates a block diagram illustrating an electronic system including semiconductor devices according to various embodiments.

Referring to FIG. 8, semiconductor devices according to various embodiments of the inventive concept may be applied to an electronic system 2100.

The electronic system 2100 may include a body 2110, a microprocessor unit 2120, a power unit 2130, a function unit 2140, and/or a display controller unit 2150.

The body 2110 may be a system board or motherboard having a PCB.

The microprocessor unit 2120, the power unit 2130, the function unit 2140, and the display controller unit 2150 may be installed or mounted on the body 2110.

A display unit 2160 may be disposed on a top surface of the body 2110 or outside the body 2110. For example, the display unit 2160 may be disposed on a surface of the body 2110 and display an image processed by the display controller unit 2150.

The power unit 2130 may receive a predetermined voltage from an external power source, divide the predetermined voltage into various voltage levels, and supply those voltages to the microprocessor unit 2120, the function unit 2140, the display controller unit 2150, and the like.

The microprocessor unit 2120 may receive a voltage from the power unit 2130 and control the function unit 2140 and the display unit 2160.

The function unit 2140 may implement various functions of the electronic system 2100. For instance, when the electronic system 2100 is a mobile electronic product, such as a portable phone, the function unit 2140 may include several components capable of performing wireless communication functions, such as output of an image to the display unit 2160 or output of a voice to a speaker, by dialing or communication with an external unit 2170. When the function unit 2140 includes a camera, the function unit 2140 may serve as an image processor.

In other applied embodiments, when the electronic system 2100 is connected to a memory card to increase capacity, the function unit 2140 may be a memory card controller. The function unit 2140 may exchange signals with the external unit 2170 through a wired or wireless communication unit 2180.

In addition, when the electronic system 2100 needs a universal serial bus (USB) to expand functions thereof, the function unit 2140 may serve as an interface controller.

At least one of the microprocessor unit 2120 and the function unit 2140 may include semiconductor devices according to various embodiments.

According to various embodiments, after all divided first and second damascene patterns are first formed, the damascene patterns may be buried or filled with a damascene mask material, and a molding layer may be etched at once to form a trench in which a damascene wiring is to be formed.

Over-etching of a damascene stitch pattern (in which the divided damascene patterns overlap) may be prevented, and the molding layer may not exist inside the trench in which the damascene wiring is to be formed. Therefore, an electrical short between the damascene wiring and the underlying conductive structure, a burying failure of the damascene wiring, or the like, may be prevented.

The embodiments may provide a method of manufacturing a semiconductor device having a damascene wiring structure with a good profile.

The embodiments may provide a method of manufacturing a semiconductor device using a damascene stitch pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
    forming a molding layer on a substrate;
    sequentially forming a first damascene mask layer and a first mask layer on the molding layer;
    forming a first mask layer pattern by etching the first mask layer;
    forming a first damascene pattern by partially etching the first damascene mask layer using the first mask layer pattern as a mask;
    forming a second damascene mask layer on the first mask layer pattern to bury the first damascene pattern;
    forming a second damascene pattern partially overlapping the first damascene pattern by etching the second damascene mask layer and the first mask layer pattern;
    connecting the first damascene pattern and the second damascene pattern by removing a portion of the first mask layer pattern exposed by the second damascene pattern;
    forming a third damascene mask layer on the second damascene mask layer to bury the second damascene pattern; and
    forming a trench extending from the first and second damascene patterns by etching the third, second, and first damascene mask layers and the molding layer using remaining portions of the first mask layer pattern.

2. The method as claimed in claim 1, further comprising, before forming the second damascene pattern:
    forming a second mask layer on the second damascene mask layer; and
    forming a second mask layer pattern opening a region in which the second damascene pattern is to be formed by etching the second mask layer.

3. The method as claimed in claim 2, wherein, as the portion of the first mask layer pattern exposed by the second damascene pattern is removed, the second mask layer pattern is also removed.

4. The method as claimed in claim 1, wherein forming the second damascene pattern by etching the second damascene mask layer and the first mask layer pattern includes forming a second damascene mask layer pattern that buries the first damascene pattern and that includes the second damascene pattern therein.

5. The method as claimed in claim 4, wherein forming the trench extending from the first and second damascene patterns by etching the third, second, first damascene mask layers and the molding layer using the remaining portions of the first mask layer pattern includes:

retaining portions of the second damascene mask layer pattern in the first damascene pattern by etching back the third damascene mask layer and the second damascene mask layer pattern to the remaining portions of the first mask layer pattern; and etching the remaining portions of the second damascene mask layer pattern, first damascene mask layer, and molding layer using the remaining portions of the first mask layer pattern.

6. The method as claimed in claim 1, further comprising forming a metallic hard mask layer on the molding layer prior to forming the first damascene mask layer.

7. The method as claimed in claim 1, wherein forming the trench includes uniformly etching the molding layer such that the trench has a flat bottom.

8. The method as claimed in claim 1, further comprising, after forming the trench:

removing the first damascene mask layer; and forming a damascene wiring to bury the trench.

9. The method as claimed in claim 1, wherein the first, second, and third damascene mask layers each include carbon-containing layers.

10. The method as claimed in claim 1, wherein the first mask layer includes silicon oxynitride.

11. The method as claimed in claim 1, further comprising forming a damascene wiring in the trench.

12. A method of manufacturing a semiconductor device, the method comprising:

forming a molding layer on a semiconductor substrate, the semiconductor substrate including a cell array region and a core/peripheral circuit region;

sequentially forming a first damascene mask layer and a first mask layer on the molding layer;

forming a first mask layer pattern by etching the first mask layer;

forming a first damascene pattern in the core/peripheral circuit region by partially etching the first damascene mask layer;

forming a second damascene mask layer on the first mask layer pattern and the first damascene pattern;

forming a second damascene pattern that partially overlaps the first damascene pattern in the core/peripheral circuit region by etching the second damascene mask layer and the first mask layer pattern;

connecting the first damascene pattern and the second damascene pattern by removing a portion of the first mask layer pattern that is exposed by the second damascene pattern;

forming a third damascene mask layer on the second damascene mask layer and the second damascene pattern; and forming trenches extending from the first and second damascene patterns by etching the third, second, and first damascene mask layers and the molding layer using remaining portions of the first mask layer pattern.

13. The method as claimed in claim 12, further comprising, before forming the second damascene pattern:

forming a second mask layer on the second damascene mask layer; and forming a second mask layer pattern opening a region in which the second damascene pattern is to be formed by etching the second mask layer.

14. The method as claimed in claim 12, further comprising forming a metallic hard mask layer on the molding layer before forming the first damascene mask layer.

15. The method as claimed in claim 12, further comprising forming cell trenches that expose regions in which bit lines of the cell array region are to be formed in the molding layer, before forming the first damascene mask layer, wherein the first damascene mask layer buries the cell trenches.

16. The method as claimed in claim 12, wherein forming the trenches includes uniformly etching the molding layer such that the trenches have flat bottoms.

17. A method of manufacturing a semiconductor device, the method comprising:

forming a molding layer on a substrate;

forming a first damascene mask layer on the molding layer;

forming a first mask layer on the first damascene mask layer;

forming a first mask layer pattern by etching the first mask layer;

forming a first damascene pattern by partially etching the first damascene mask layer using the first mask layer pattern as a mask;

forming a second damascene mask layer on the first mask layer pattern such that the second damascene mask layer fills the first damascene pattern;

forming a second damascene pattern that partially overlaps the first damascene pattern by etching the second damascene mask layer;

connecting the first damascene pattern and the second damascene pattern by removing a portion of the first mask layer pattern exposed by the second damascene pattern and further etching the second damascene mask layer;

forming a third damascene mask layer on the second damascene mask layer such that the third damascene mask layer fills the second damascene pattern;

patterning remaining layers on the molding layer to form a trench mask pattern; and forming a trench in the molding layer by etching the molding layer using the trench mask pattern as a mask.

18. The method as claimed in claim 17, further comprising forming a metallic hard mask layer on the molding layer prior to forming the first damascene mask layer.

19. The method as claimed in claim 17, wherein forming the trench includes uniformly etching the molding layer such that the trench has a flat bottom.

20. The method as claimed in claim 17, wherein:

the first, second, and third damascene mask layers each include carbon-containing layers, and the first mask layer includes silicon oxynitride.

* * * * *